US012075636B2

(12) United States Patent
Jiang et al.

(10) Patent No.: US 12,075,636 B2
(45) Date of Patent: Aug. 27, 2024

(54) THRESHOLD VOLTAGE-MODULATED MEMORY DEVICE USING VARIABLE-CAPACITANCE AND METHODS OF FORMING THE SAME

(71) Applicant: Taiwan Semiconductor Manufacturing Company Limited, Hsinchu (TW)

(72) Inventors: Fa-Shen Jiang, Taoyuan (TW); Hsia-Wei Chen, Taipei (TW); Hai-Dang Trinh, Hsinchu (TW); Hsun-Chung Kuang, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 18/358,867

(22) Filed: Jul. 25, 2023

(65) Prior Publication Data
US 2023/0371288 A1    Nov. 16, 2023

Related U.S. Application Data

(62) Division of application No. 17/227,438, filed on Apr. 12, 2021, now Pat. No. 11,856,801.
(Continued)

(51) Int. Cl.
*G11C 11/00* (2006.01)
*H10B 99/00* (2023.01)
(Continued)

(52) U.S. Cl.
CPC .......... *H10B 99/00* (2023.02); *G11C 11/1673* (2013.01); *G11C 11/1675* (2013.01);
(Continued)

(58) Field of Classification Search
CPC ............ G11C 11/1673; G11C 11/1675; G11C 13/004; G11C 13/0069; G11C 13/0097;
(Continued)

(56) References Cited

U.S. PATENT DOCUMENTS

2005/0059187 A1    3/2005  Gilton
2006/0223251 A1    10/2006 Isogai
(Continued)

FOREIGN PATENT DOCUMENTS

CN      1574367 A        2/2005
KR   1020040101657 A    12/2004
(Continued)

OTHER PUBLICATIONS

Taiwan Patent and Trademark Office, Application No. 110121642 Office Action dated Mar. 17, 2022, 5 pages.
(Continued)

*Primary Examiner* — Hien N Nguyen
(74) *Attorney, Agent, or Firm* — The Marbury Law Group, PLLC

(57) ABSTRACT

A memory device includes a field effect transistor and a variable-capacitance capacitor. A gate structure includes a gate dielectric and an intermediate electrode. The variable-capacitance capacitor includes a lower capacitor plate comprising the intermediate electrode, an upper capacitor plate comprising a control gate electrode, and a variable-capacitance node dielectric and including an electrical-field-programmable metal oxide material. The electrical-field-programmable metal oxide material provides a variable effective dielectric constant, and a data bit may be stored as a dielectric state of the variable-capacitance node dielectric in the memory device. The variable-capacitance node dielectric provides reversible electrical field-dependent
(Continued)

resistivity modulation, or reversible electrical field-dependent movement of metal atoms therein.

20 Claims, 23 Drawing Sheets

Related U.S. Application Data

(60) Provisional application No. 63/039,534, filed on Jun. 16, 2020.

(51) Int. Cl.
  *G11C 11/16* (2006.01)
  *G11C 13/00* (2006.01)

(52) U.S. Cl.
  CPC ........ *G11C 13/004* (2013.01); *G11C 13/0069* (2013.01); *G11C 13/0097* (2013.01)

(58) Field of Classification Search
  CPC .............. G11C 13/003; G11C 13/0007; G11C 2213/53; G11C 16/0483; H10B 99/00; H10B 61/10; H10B 61/22; H10B 63/20; H10B 63/30; H10B 63/22; H10B 63/34; H10N 70/24
  See application file for complete search history.

(56) References Cited

U.S. PATENT DOCUMENTS

| | | | |
|---|---|---|---|
| 2015/0303313 A1* | 10/2015 | Mallela | H01L 29/0847 257/295 |
| 2019/0130957 A1 | 5/2019 | Muller | |
| 2020/0098828 A1* | 3/2020 | Chen | H10B 63/30 |
| 2020/0098932 A1* | 3/2020 | Lajoie | H10B 12/33 |
| 2021/0175253 A1* | 6/2021 | Han | H10B 51/10 |
| 2022/0189526 A1* | 6/2022 | Gong | G11C 11/2255 |
| 2022/0216235 A1* | 7/2022 | Lin | H10B 51/50 |
| 2022/0328501 A1* | 10/2022 | Wu | H01L 29/7869 |

FOREIGN PATENT DOCUMENTS

| | | |
|---|---|---|
| TW | I406381 B1 | 8/2013 |
| TW | I556349 B | 11/2016 |

OTHER PUBLICATIONS

Korean Patent and Trademark Office, Application No. 10-2021-0075318, Office Action, mailed Oct. 17, 2022 6 pages.
German Patent and Trademark Office, Application No. 10 2021 109 728.2, Office Action, mailed Apr. 20, 2023, 9 pages.
Chinese Patent and Trademark Office, CN Application No. 202110665425.4; Office Action dated Jan. 16, 2024, 7 pages.

* cited by examiner

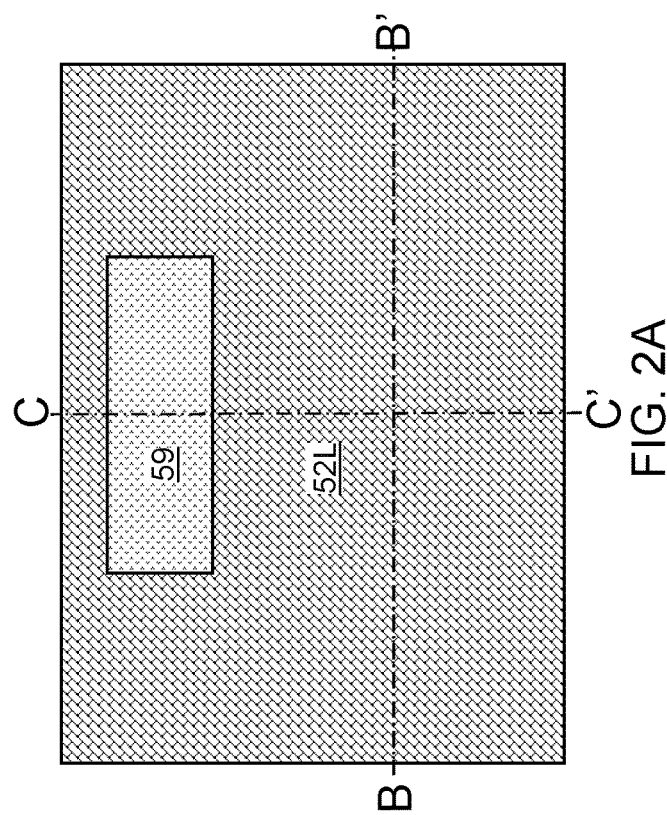
FIG. 2A
FIG. 2B
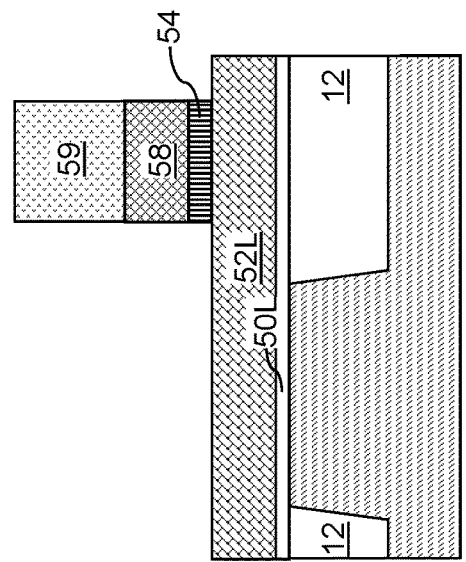
FIG. 2C

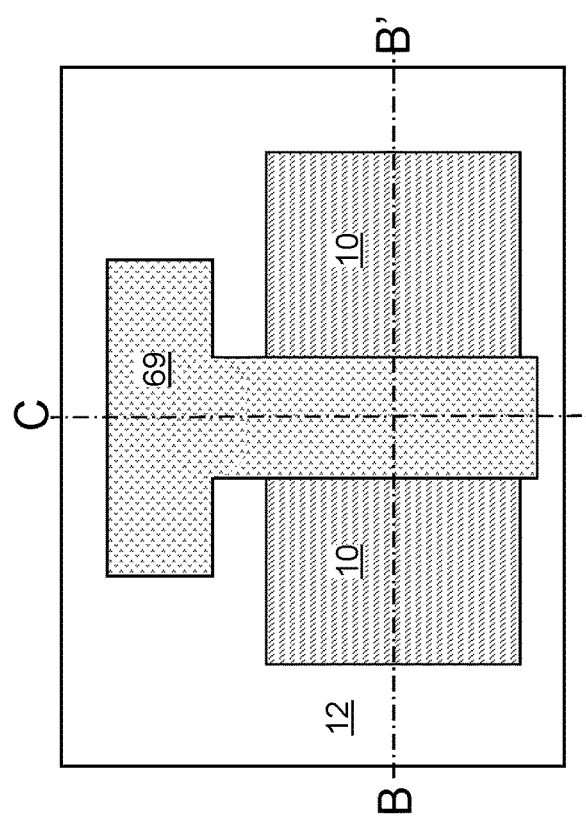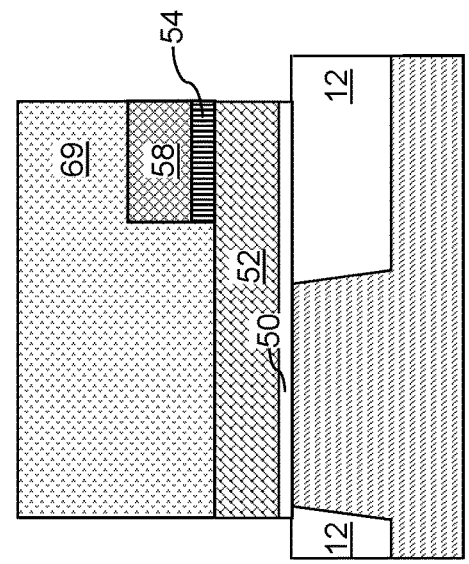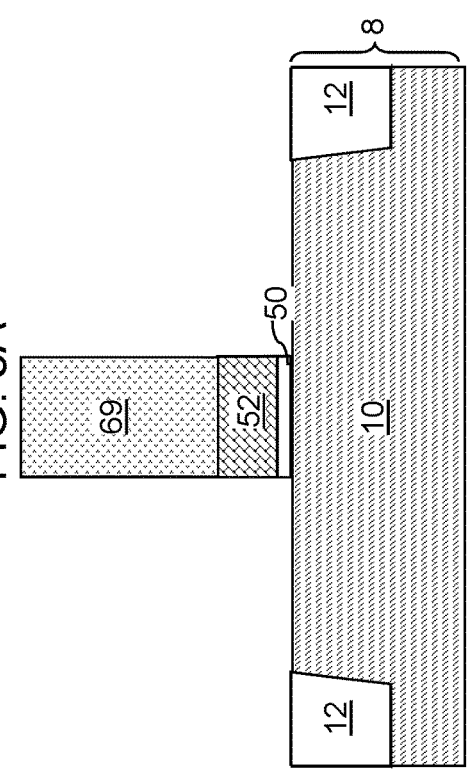
FIG. 3A
FIG. 3B
FIG. 3C

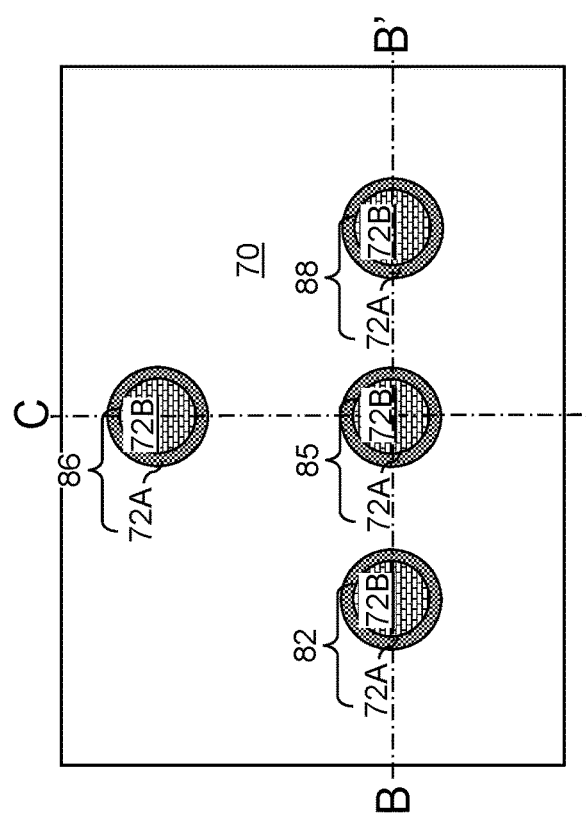
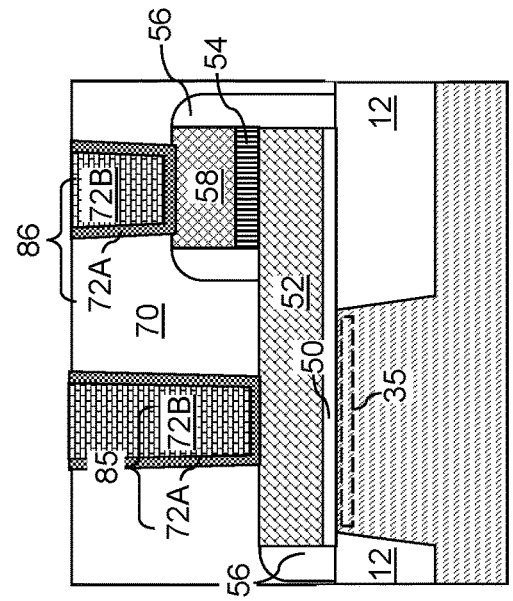
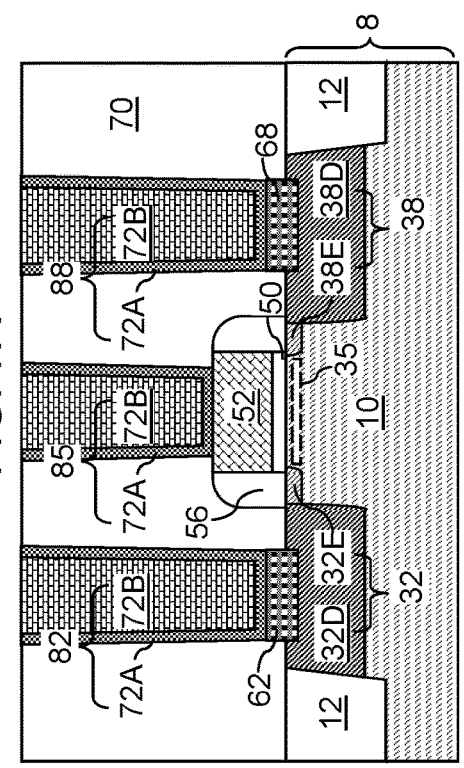
FIG. 7A
FIG. 7B
FIG. 7C

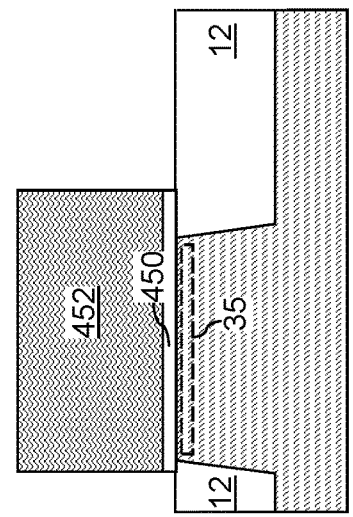
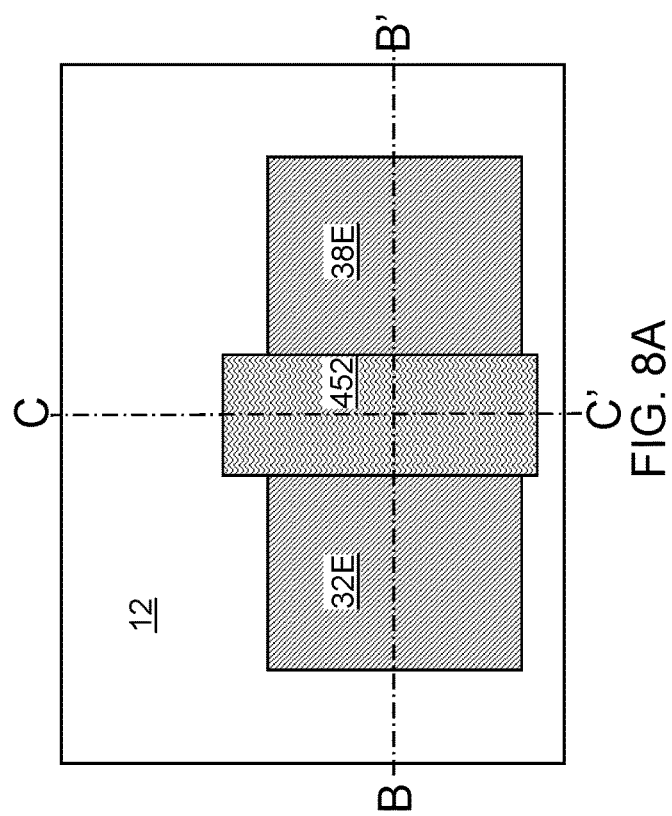
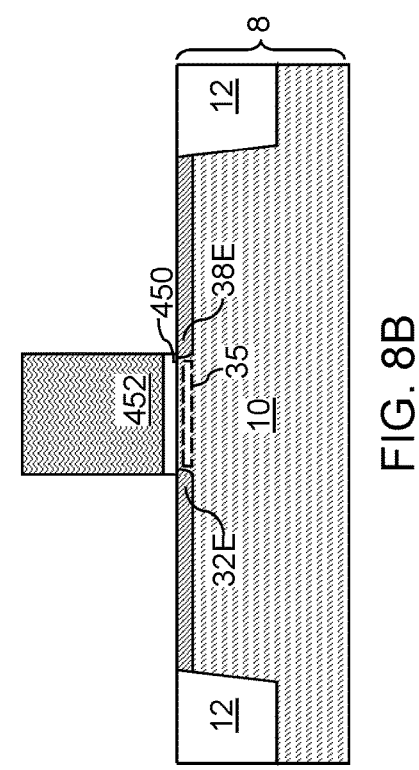
FIG. 8A
FIG. 8B
FIG. 8C

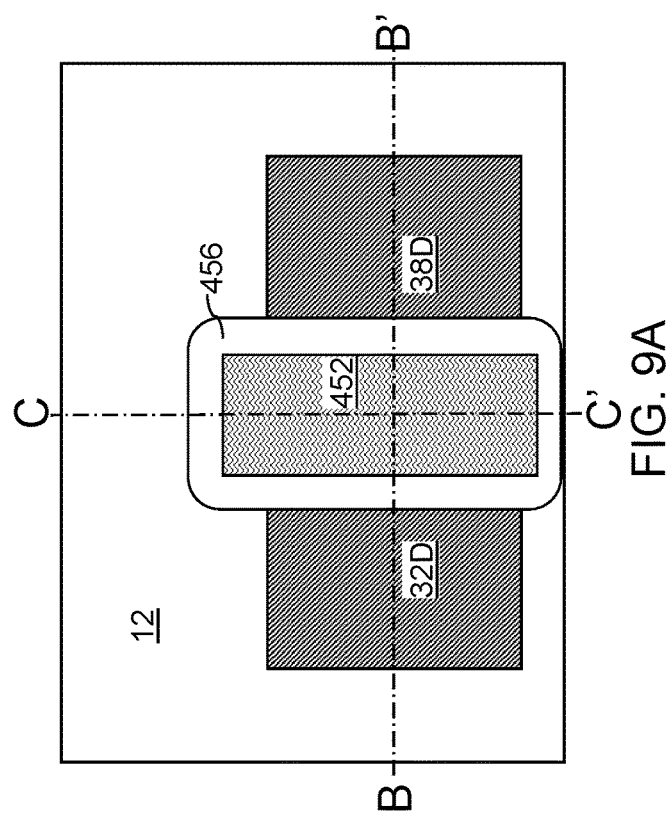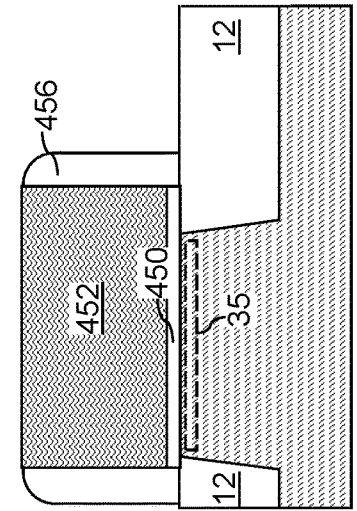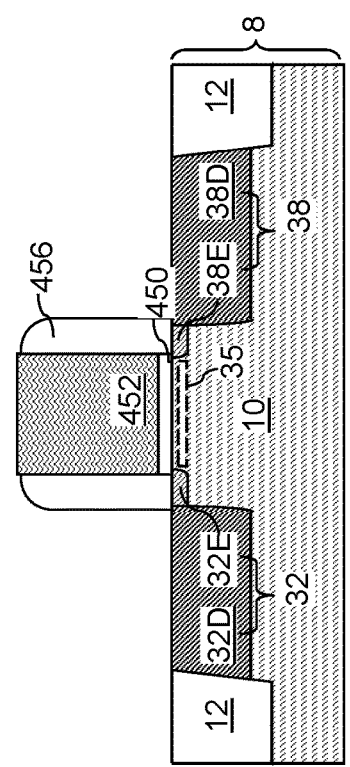
FIG. 9A
FIG. 9B
FIG. 9C

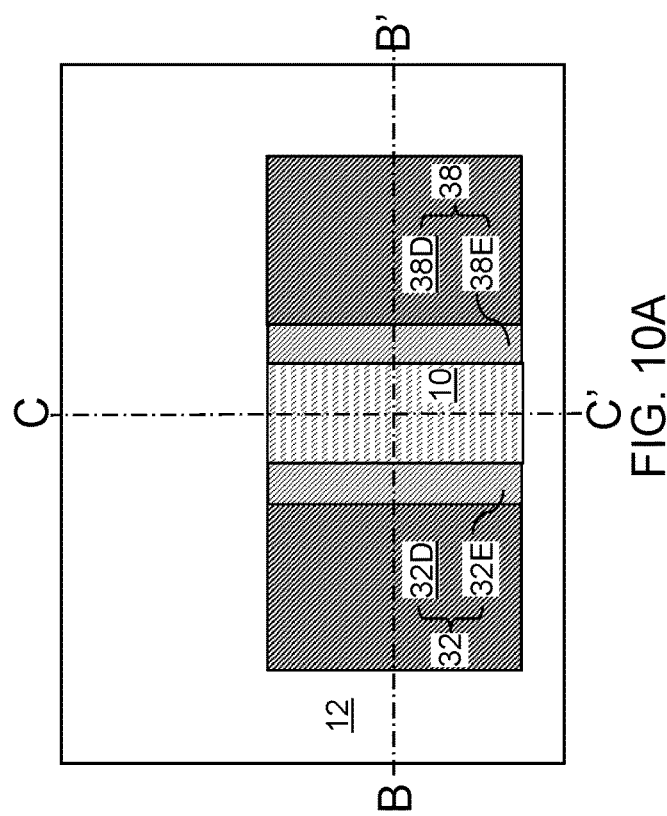
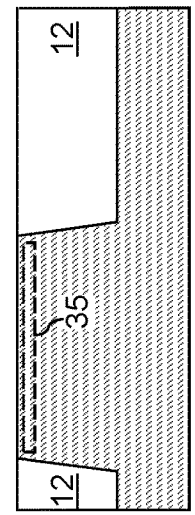
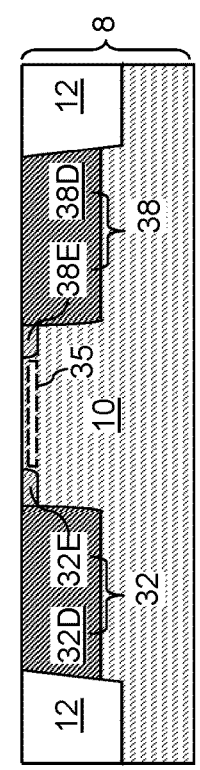
FIG. 10A
FIG. 10C
FIG. 10B

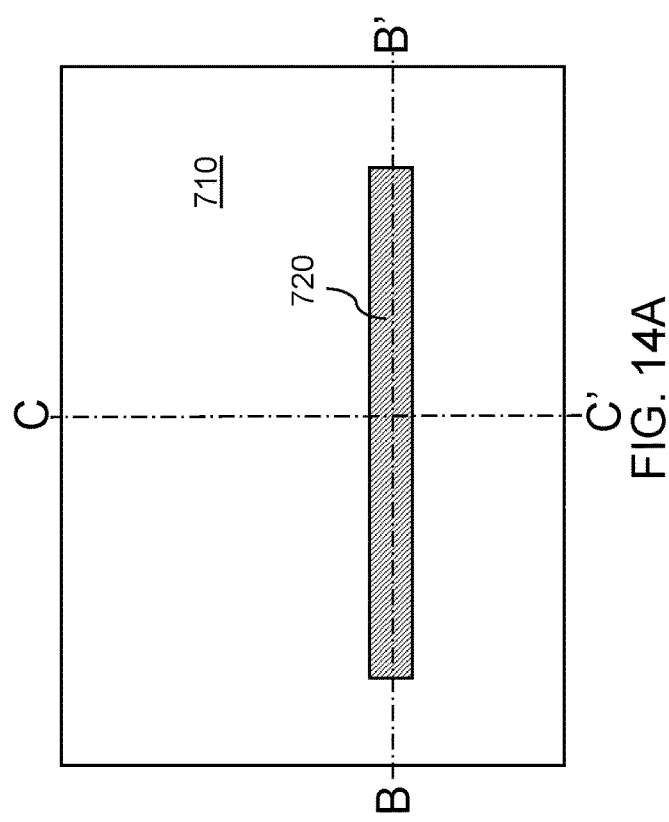
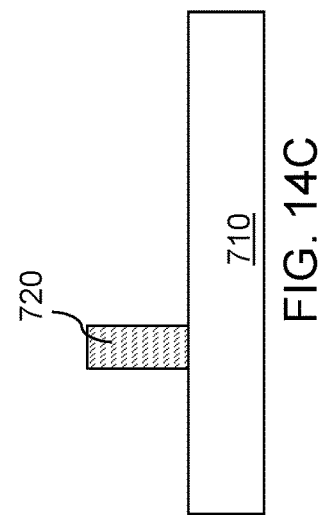
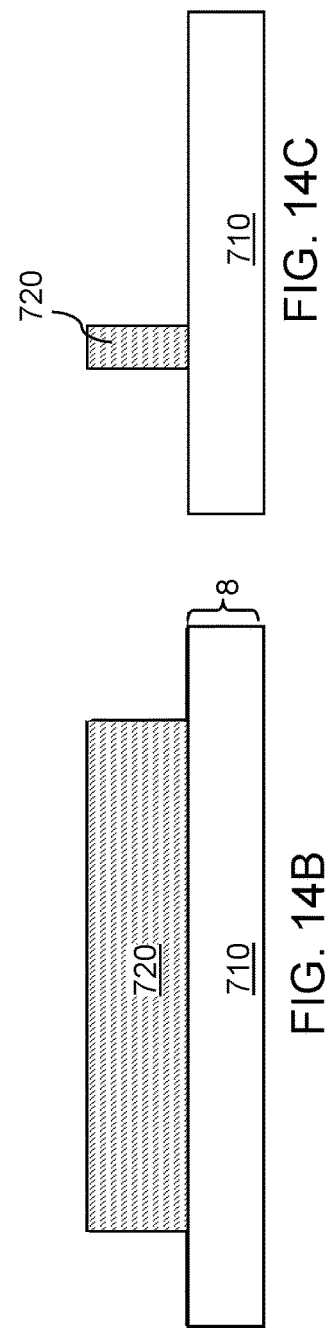
FIG. 14A
FIG. 14C
FIG. 14B

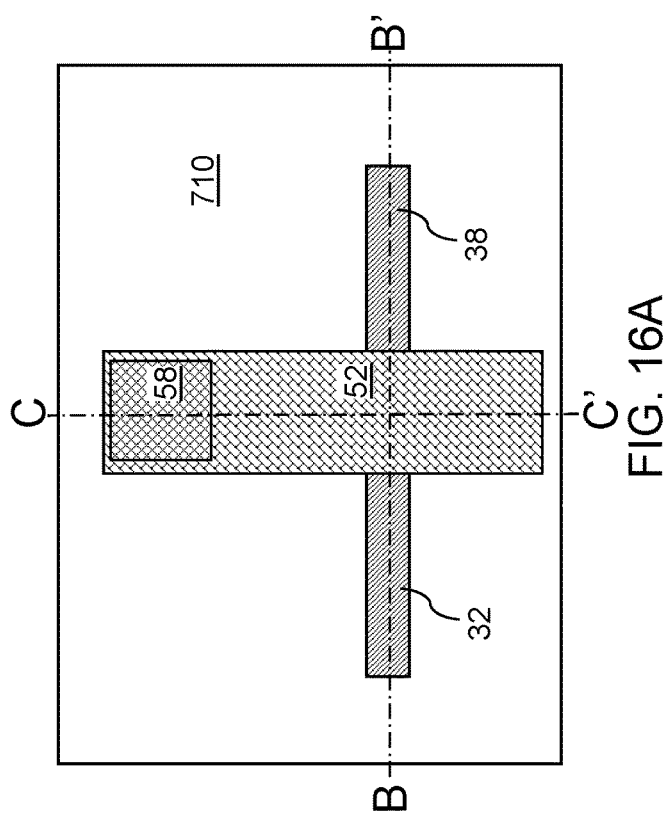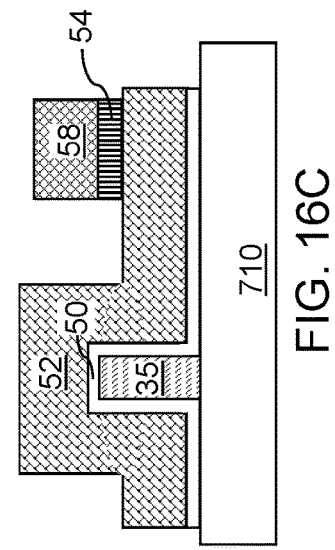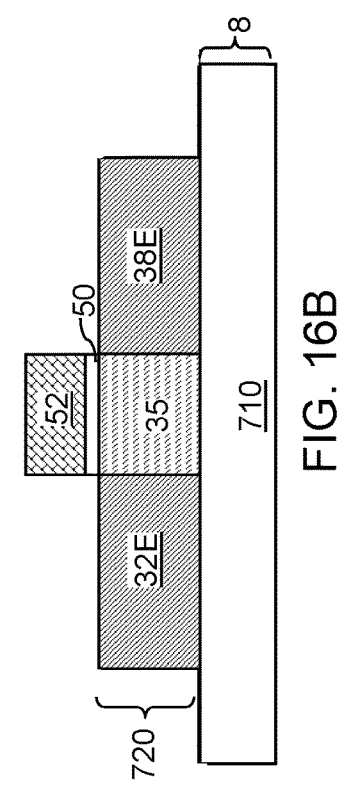

THRESHOLD VOLTAGE-MODULATED MEMORY DEVICE USING VARIABLE-CAPACITANCE AND METHODS OF FORMING THE SAME

RELATED APPLICATIONS

This application is a divisional application of U.S. application Ser. No. 17/227,438 entitled "Threshold Voltage-Modulated Memory Device Using Variable Capacitance and Methods of Forming the Same," filed on Apr. 12, 2021, which claims the benefit of priority from U.S. Provisional Application No. 63/039,534 entitled "Novel Method to Reduce Flash Memory Power Consumption" filed on Jun. 16, 2020, the entire contents of both of which are hereby incorporated by reference for all purposes.

BACKGROUND

The threshold voltage of a field effect transistor is affected by the capacitance of the gate electrode. If the gate voltage is higher than the threshold voltage, the field effect transistor is turned on. If the gate voltage is lower than the threshold voltage, the field effect transistor is turned off. Conventional charge trapping memory devices often include large program/erase power (greater than 5 volts) to achieve MOSFET threshold voltage modulation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A is a top-down view of the first exemplary structure after formation of a control gate electrode and a variable-capacitance node dielectric according to an embodiment of the present disclosure.

FIG. 2B is a vertical cross-sectional view of the first exemplary structure along the vertical plane B-B' of FIG. 2A.

FIG. 2C is a vertical cross-sectional view of the first exemplary structure along the vertical plane C-C' of FIG. 2A.

FIG. 3A is a top-down view of the first exemplary structure after formation of an intermediate electrode and a gate dielectric according to an embodiment of the present disclosure.

FIG. 3B is a vertical cross-sectional view of the first exemplary structure along the vertical plane B-B' of FIG. 3A.

FIG. 3C is a vertical cross-sectional view of the first exemplary structure along the vertical plane C-C' of FIG. 3A.

FIG. 7A is a top-down view of the first exemplary structure after formation of contact via structures according to an embodiment of the present disclosure.

FIG. 7B is a vertical cross-sectional view of the first exemplary structure along the vertical plane B-B' of FIG. 7A.

FIG. 7C is a vertical cross-sectional view of the first exemplary structure along the vertical plane C-C' of FIG. 7A.

FIG. 8A is a top-down view of a second exemplary structure after formation of a shallow trench isolation structure, a sacrificial dielectric layer, a dummy gate structure, and a source extension region and a drain extension region according to an embodiment of the present disclosure.

FIG. 8B is a vertical cross-sectional view of the second exemplary structure along the vertical plane B-B' of FIG. 8A.

FIG. 8C is a vertical cross-sectional view of the second exemplary structure along the vertical plane C-C' of FIG. 8A.

FIG. 9A is a top-down view of the second exemplary structure after formation of a dummy spacer, a deep source region, and a deep drain region according to an embodiment of the present disclosure.

FIG. 9B is a vertical cross-sectional view of the second exemplary structure along the vertical plane B-B' of FIG. 9A.

FIG. 9C is a vertical cross-sectional view of the second exemplary structure along the vertical plane C-C' of FIG. 9A.

FIG. 10A is a top-down view of the second exemplary structure after removal of dummy structures according to an embodiment of the present disclosure.

FIG. 10B is a vertical cross-sectional view of the second exemplary structure along the vertical plane B-B' of FIG. 10A.

FIG. 10C is a vertical cross-sectional view of the second exemplary structure along the vertical plane C-C' of FIG. 10A.

FIG. 14A is a top-down view of a third exemplary structure after formation of a semiconductor fin according to an embodiment of the present disclosure.

FIG. 14B is a vertical cross-sectional view of the third exemplary structure along the vertical plane B-B' of FIG. 14A.

FIG. 14C is a vertical cross-sectional view of the third exemplary structure along the vertical plane C-C' of FIG. 14A.

FIG. 16A is a top-down view of the third exemplary structure after formation of a variable-capacitance node dielectric and a control gate electrode according to an embodiment of the present disclosure.

FIG. 16B is a vertical cross-sectional view of the third exemplary structure along the vertical plane B-B' of FIG. 16A.

FIG. 16C is a vertical cross-sectional view of the third exemplary structure along the vertical plane C-C' of FIG. 16A.

DETAILED DESCRIPTION

Figure 1C:
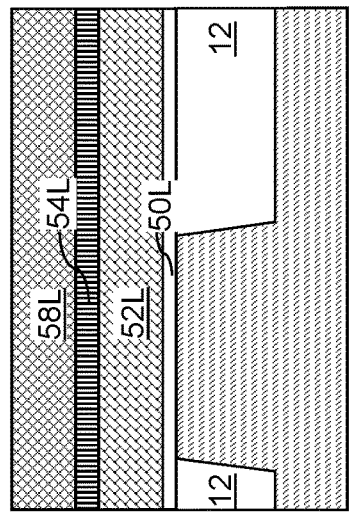
FIG. 1C is a vertical cross-sectional view of the first exemplary structure along the vertical plane C-C' of FIG. 1A.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The present disclosure is directed to generally to semiconductor devices, and specifically to a threshold voltage-modulated memory device using variable-capacitance and methods of forming the same, the various aspects of which are described herein in detail. Conventional charge trapping memory uses large program/erase power (greater than 5 volts) to achieve MOSFET threshold voltage modulation. By stacking resistive switching oxide layers and capping a gate on a MOSFET, a variable-capacitance may modulate the threshold voltage by resistive switching. By inserting a RRAM/PCRAM/MRAM as a variable capacitor on MOSFET the threshold voltage may be modulated through resistive switching. In such embodiments, the power consumption of a program/erase operation may be reduced to less than 5 volts as compared to other charge trapping memory devices that may require as much as 10 volts.

Figure 1A:
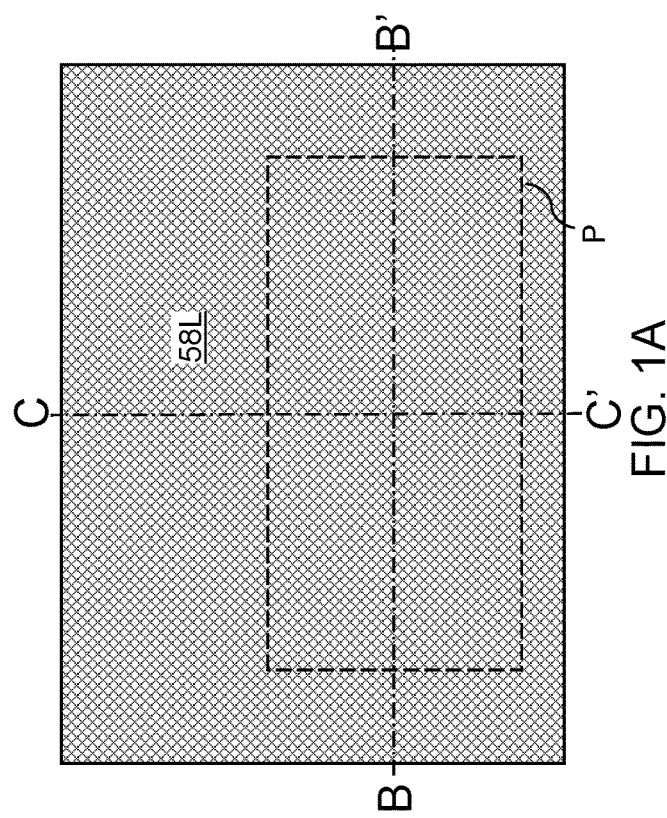
FIG. 1A is a top-down view of a first exemplary structure after formation of a shallow trench isolation structure, a gate dielectric material layer, an intermediate electrode material layer, a variable-capacitance node dielectric material layer, and a control gate electrode material layer according to an embodiment of the present disclosure.
Figure 1B:
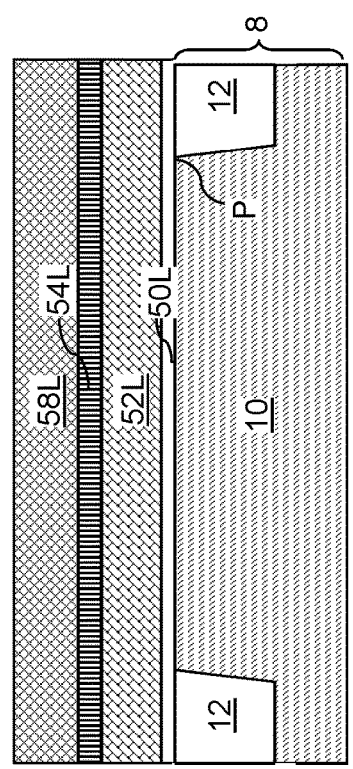
FIG. 1B is a vertical cross-sectional view of the first exemplary structure along the vertical plane B-B' of FIG. 1A.

FIG. 1A is a top-down view of an first exemplary structure after formation of a shallow trench isolation structure, a gate dielectric material layer, an intermediate electrode material layer, a variable-capacitance node dielectric material layer, and a control gate electrode material layer according to an embodiment of the present disclosure. FIG. 1B is a vertical cross-sectional view of the first exemplary structure along the vertical plane B-B' of FIG. 1A. FIG. 1C is a vertical cross-sectional view of the first exemplary structure along the vertical plane C-C' of FIG. 1A. Referring to FIGS. 1A-1C, an first exemplary structure according to an embodiment of the present disclosure is illustrated, which includes a substrate 8 including a semiconductor material layer 10. The substrate 8 may be a bulk semiconductor substrate in which the semiconductor material layer 10 may extend from a front surface to a backside surface, or may be a semiconductor-on-insulator (SOI) substrate including a buried insulator layer (not shown) underlying the semiconductor material layer 10 and a handle substrate (not shown) that underlies the buried insulator layer. For example, the substrate 8 may be a commercially available single crystalline bulk semiconductor substrate or a commercially available semiconductor-on-insulator substrate.

The semiconductor material layer 10 may include a single crystalline semiconductor material or a polycrystalline semiconductor material. In one embodiment, the entirety of the semiconductor material layer 10 may include a single crystalline semiconductor material such as single crystalline silicon. The semiconductor material of the semiconductor material layer 10 may have a doping of a first conductivity type, which may be p-type or n-type. The atomic concentration of dopants of the first conductivity type in the semiconductor material layer 10 may be in a range from $1.0 \times 10^{14}/cm^3$ to $3.0 \times 10^{17}/cm^3$, although lesser and greater atomic concentrations may also be used. In one embodiment, the semiconductor material layer 10 may consist essentially of silicon and dopants of the first conductivity type.

Shallow trench isolation structure 12 may be formed in an upper portion of the semiconductor material layer 10. For example, shallow trenches having a depth in a range from 50 nm to 500 nm may be formed through the top surface of the semiconductor material layer 10 by applying and patterning a photoresist layer over the top surface of the semiconductor material layer 10, and by transferring the pattern in the photoresist layer into the upper portion of the semiconductor material layer 10 using an anisotropic etch process. The photoresist layer may be subsequently removed, for example, by ashing. A dielectric material may be deposited in the shallow trenches, and excess portions of the dielectric may be removed from above the horizontal plane including the top surface of the semiconductor material layer 10 using a planarization process such as a chemical mechanical polishing (CMP) process. The remaining portions of the dielectric material that fill the shallow trenches comprise the shallow trench isolation structure 12. The shallow trench isolation structure 12 may laterally surround device regions, one of which is illustrated in FIGS. 1A-1C. For example, a device region may have a periphery P that is laterally surrounded by the shallow trench isolation structure 12. In one embodiment, each device region may be laterally surrounded by a shallow trench isolation structure 12. While the embodiments of the present disclosure is described using a single device region, it may be understood that multiple device regions laterally surrounded by a respective shallow trench isolation structure 12 may be formed in the first exemplary structure.

A gate dielectric material layer 50L may be formed over the top surface of the semiconductor material layer 10. The gate dielectric material layer 50L may include a semiconductor oxide material formed by oxidation of a surface portion of the semiconductor material layer 10. For example, the semiconductor material layer 10 may include silicon, and a thermal oxidation process or a plasma oxidation process may be performed to convert the surface portion of the semiconductor material layer 10 into a silicon oxide layer. Alternatively or additionally, a gate dielectric material may be deposited over the top surface of the substrate 8. The gate dielectric material may include silicon oxide and/or a dielectric metal oxide material such as aluminum oxide, hafnium oxide, yttrium oxide, lanthanum oxide, tantalum oxide, titanium oxide, zirconium oxide, hafnium aluminum oxide, hafnium zirconium oxide, hafnium tantalum oxide, etc. Other suitable gate dielectric materials may be within the contemplated scope of disclosure. The gate dielectric material may be deposited by a conformal deposition process such as a chemical vapor deposition process or an atomic layer deposition process. The thickness of the gate dielectric material layer 50L may be in a range from 1 nm to 10 nm, such as from 2 nm to 6 nm, although lesser and greater thicknesses may also be used.

An intermediate electrode material layer 52L may be deposited over the gate dielectric material layer 50L. The intermediate electrode material layer 52L includes a conductive material that may be subsequently used to form a gate electrode. Specifically, the intermediate electrode material layer 52L includes a material that may provide a suitable threshold voltage to the field effect transistor to be subsequently formed. In an illustrative example, the intermediate electrode material layer 52L may include at least one conductive material such as doped polysilicon, a metal silicide, platinum, ruthenium, iridium, aluminum, molybdenum, palladium, tantalum, zirconium, osmium, titanium, rhodium, rhenium, alloys thereof, or combinations thereof. Other suitable intermediate electrode materials may be within the contemplated scope of disclosure. The intermediate electrode material layer 52L may be deposited by a conformal deposition process such as a chemical vapor deposition process, and/or by a nonconformal deposition process such as a physical vapor deposition process. The thickness of the intermediate electrode material layer 52L may be in a range from 5 nm to 100 nm, such as from 10 nm to 40 nm, although lesser and greater thicknesses may also be used.

A variable-capacitance node dielectric material layer 54L may be subsequently deposited over the intermediate electrode material layer 52L. The variable-capacitance node dielectric material layer 54L includes a dielectric material that may provide a variable effective dielectric constant depending on the hysteresis effect of an external vertical electrical field that is applied thereacross. The variable-capacitance node dielectric material layer 54L is subsequently used as a node oxide of a capacitor structure to be subsequently formed. The effective dielectric constant of the variable-capacitance node dielectric material layer 54L may change at least by 5%, and preferably at least by 10%, and may change by a percentage in a range from 10% to 100% relative to a minimum value, although greater percentage changes may also be used.

In one embodiment, the variable-capacitance node dielectric material layer 54L may include, or may consist essentially of, a metal oxide material that provides reversible electrical field-dependent resistivity modulation. The reversible electrical field-dependent resistivity modulation within the material of the variable-capacitance node dielectric material layer 54L may provide two dielectric states that may be provided by using the hysteresis effect of a vertical electrical field across to be subsequently applied thereacross. The two dielectric states may include a first dielectric state having a first electrical resistivity and having a first effective dielectric constant, and a second dielectric state having a second electrical resistivity and having a second effective dielectric constant. The range of the first electrical resistivity and the second electrical resistivity may be less than $1.0 \times 10^{-2}$ S/m, and may be generally in a range from $1.0 \times 10^{-15}$ S/m to $1.0 \times 10^{-3}$ S/m. Generally, the first dielectric state and the second dielectric state may provide different electrical resistivities for the metal oxide material of the variable-capacitance node dielectric material layer 54L.

In one embodiment, the variable-capacitance node dielectric material layer 54L may include an oxygen-vacancy-modulated metal oxide material or a filament-forming metal oxide. An oxygen-vacancy-modulated metal oxide material includes oxygen vacancies that drift along the direction of an externally applied electrical field. A filament-forming metal oxide material generates conductive filaments that increase the electrical conductivity of the filament-forming metal oxide material upon application of an electrical field having a field strength that exceeds a critical field strength. Resistivity modulation in a thin metal oxide material may results in a change in the effective electrical resistivity of the metal oxide material, and a change in the effective dielectric constant of the metal oxide material. Exemplary metal oxide materials that display resistivity modulation include, but are not limited to, hafnium oxide, zirconium oxide, aluminum oxide, tantalum oxide, hafnium aluminum oxide, hafnium zirconium oxide, and hafnium tantalum oxide. The metal oxide material that provides reversible electrical field-dependent resistivity modulation may be deposited by chemical vapor deposition or by physical vapor deposition.

In another embodiment, the variable-capacitance node dielectric material layer 54L includes a metal oxide material that may provide reversible electrical field-dependent movement of metal atoms therein. Generally, dielectric metal oxides and dielectric semiconductor compounds that may be used in a conductive bridge structure fall in this category. For example, the variable-capacitance node dielectric material layer 54L may include a metal oxide material such as hafnium oxide, zirconium oxide, aluminum oxide, tantalum oxide, hafnium aluminum oxide, hafnium zirconium oxide, and hafnium tantalum oxide. Alternatively, the variable-capacitance node dielectric material layer 54L may include a dielectric semiconductor compound material such as silicon oxide, silicon oxynitride, or silicon nitride. Generally, the reversible electrical field-dependent movement of metal atoms through the variable-capacitance node dielectric material layer 54L enables formation of a reversible conductive bridge within the variable-capacitance node dielectric material layer 54L. Other suitable variable-capacitance node dielectric materials may be within the contemplated scope of disclosure.

Generally, the variable-capacitance node dielectric material layer 54L may be deposited by chemical vapor deposition, atomic layer deposition, and/or physical vapor deposition. The thickness of the variable-capacitance node dielectric material layer 54L may be in a range from 2 nm to 20 nm, such as from 4 nm to 10 nm, although lesser and greater thicknesses may also be used. The variable-capacitance node dielectric material layer 54L may be thick enough to avoid dielectric breakdown during operation of a field effect transistor, and may be thin enough to apply a strong enough electrical field thereacross to effect switching from the first dielectric state to the second dielectric state, and vice versa. Generally, the variable-capacitance node dielectric material layer 54L has a variable effective dielectric constant that depends on the hysteresis effect of an electrical field thereacross.

A control gate electrode material layer 58L may be deposited over the variable-capacitance node dielectric material layer 54L. The control gate electrode material layer 58L includes a conductive material that is conducive to generation of two dielectric states in conjunction with the variable-capacitance node dielectric material layer 54L and the intermediate electrode material layer 52L. In one embodiment, the control gate electrode material layer 58L includes a metallic material that is different from the conductive material of the intermediate electrode material layer 52L so that asymmetry in material composition is provided between the control gate electrode material layer 58L and the intermediate electrode material layer 52L with respect to the variable-capacitance node dielectric material layer 54L.

In one embodiment, the variable-capacitance node dielectric material layer 54L includes an oxygen-vacancy-modulated metal oxide material or a filament-forming metal oxide, and the control gate electrode material layer 58L includes a metallic material that is not prone to bulk diffusion or surface diffusion of materials under device operating conditions. In one embodiment, the control gate electrode material layer 58L includes a transition metal having a melting point higher than 1,000 degrees Celsius or a conductive metallic nitride material. For example, the control gate electrode material layer 58L may include a metal such as hafnium, zirconium, tungsten, tantalum, titanium, molybdenum, niobium, rhenium, osmium, iridium, or combinations thereof. In another embodiment, the control gate electrode material layer 58L may include a conductive metallic nitride material such as TiN, TaN, or WN. Other suitable control gate electrode materials may be within the contemplated scope of disclosure.

In another embodiment, the variable-capacitance node dielectric material layer 54L includes a metal oxide material that may provide reversible electrical field-dependent movement of metal atoms therein, and the control gate electrode material layer 58L includes a metallic material that is conducive to diffusion of metal within the variable-capacitance node dielectric material layer 54L. In one embodiment, the control gate electrode material layer 58L comprises, and/or consists essentially of, a conductive bridge metallic material selected from copper, a copper-containing compound or intermetallic alloy, silver, a silver-containing compound or intermetallic alloy, tellurium, a tellurium-containing compound or intermetallic alloy, aluminum, and an aluminum-containing compound or intermetallic alloy.

The control gate electrode material layer 58L may be deposited by chemical vapor deposition, physical vapor deposition, or atomic layer deposition. The thickness of the control gate electrode material layer 58L may be in a range from 5 nm to 100 nm, such as from 10 nm to 40 nm, although lesser and greater thicknesses may also be used.

FIG. 2A is a top-down view of the first exemplary structure after formation of a control gate electrode and a variable-capacitance node dielectric according to an embodiment of the present disclosure. FIG. 2B is a vertical cross-sectional view of the first exemplary structure along the vertical plane B-B' of FIG. 2A. FIG. 2C is a vertical cross-sectional view of the first exemplary structure along the vertical plane C-C' of FIG. 2A. Referring to FIGS. 2A-2C, a first photoresist layer may be applied over the control gate electrode material layer 58L, and may be lithographically patterned to form a first photoresist material portion 59. In one embodiment, the first photoresist material portion 59 covers a region of the shallow trench isolation structure 12, and does not cover the area of the device region. In one embodiment, the first photoresist material portion 59 is adjacent to the area of a channel region to be subsequently formed within the device region.

A first anisotropic etch process may be performed to remove unmasked portions of the control gate electrode material layer 58L and the variable-capacitance node dielectric material layer 54L. The first photoresist material portion 59 is used as an etch mask during the first anisotropic etch process. The first anisotropic etch process may include a sequence of anisotropic etch steps that etch the materials of the control gate electrode material layer 58L and the variable-capacitance node dielectric material layer 54L. A patterned portion of the control gate electrode material layer 58L comprises a control gate electrode 58. A patterned portion of the variable-capacitance node dielectric material layer 54L comprises a variable-capacitance node dielectric 54. The first photoresist material portion 59 may be subsequently removed, for example, by ashing.

FIG. 3A is a top-down view of the first exemplary structure after formation of an intermediate electrode and a gate dielectric according to an embodiment of the present disclosure. FIG. 3B is a vertical cross-sectional view of the first exemplary structure along the vertical plane B-B' of FIG. 3A. FIG. 3C is a vertical cross-sectional view of the first exemplary structure along the vertical plane C-C' of FIG. 3A. Referring to FIGS. 3A-3C, a second photoresist layer may be applied over the control gate electrode 58 and the intermediate electrode material layer 52L, and may be lithographically patterned to form a second photoresist material portion 69. The second photoresist material portion 69 may cover the entire area of the control gate electrode 58, and includes a strip portion that covers an additional area that extends across a middle portion of the device region that is adjacent to the control gate electrode 58. In one embodiment, the area of the strip portion of the second photoresist material portion 69 corresponds to the area of a channel region to be subsequently formed.

A second anisotropic etch process may be performed to remove unmasked portions of the intermediate electrode material layer 52L, and the gate dielectric material layer 50L. The second photoresist material portion 69 is used as an etch mask during the second anisotropic etch process. The second anisotropic etch process may include a sequence of anisotropic etch steps that etch the materials of the intermediate electrode material layer 52L, and the gate dielectric material layer 50L. A patterned portion of the intermediate electrode material layer 52L comprises an intermediate electrode 52. A patterned portion of the gate dielectric material layer 50L comprises a gate dielectric 50.

Figure 4C:
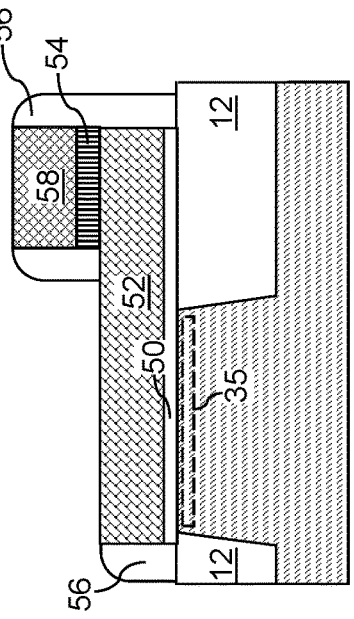
FIG. 4C is a vertical cross-sectional view of the first exemplary structure along the vertical plane C-C' of FIG. 4A.
Figure 4A:
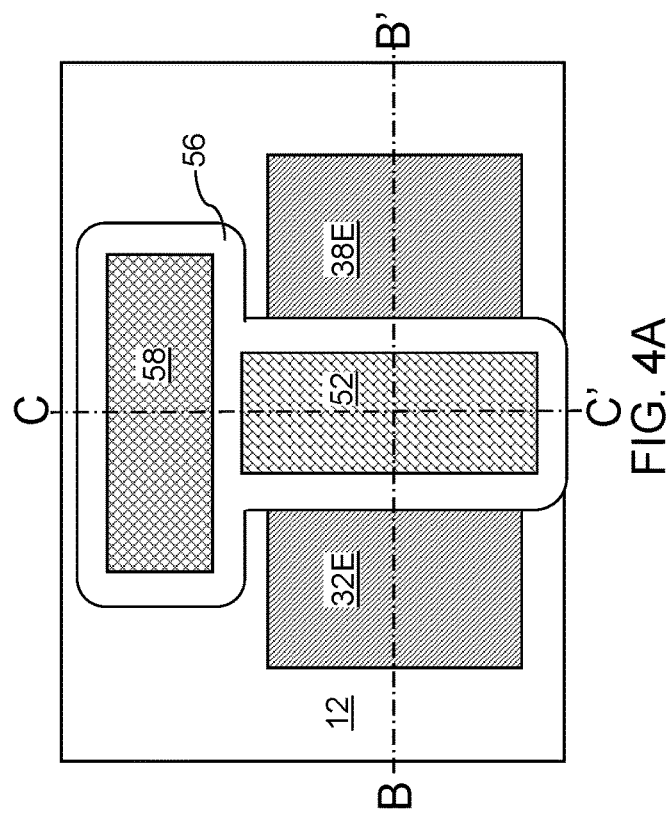
FIG. 4A is a top-down view of the first exemplary structure after formation of source/drain extension regions and a dielectric gate spacer according to an embodiment of the present disclosure.
Figure 4B:
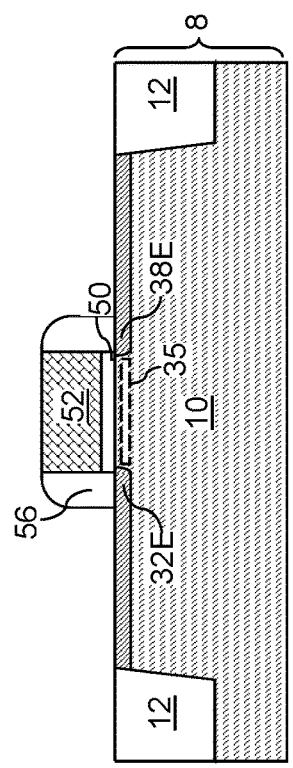
FIG. 4B is a vertical cross-sectional view of the first exemplary structure along the vertical plane B-B' of FIG. 4A.

FIG. 4A is a top-down view of the first exemplary structure after formation of source/drain extension regions and a dielectric gate spacer according to an embodiment of the present disclosure. FIG. 4B is a vertical cross-sectional view of the first exemplary structure along the vertical plane B-B' of FIG. 4A. FIG. 4C is a vertical cross-sectional view of the first exemplary structure along the vertical plane C-C' of FIG. 4A. Referring to FIGS. 4A-4C, electrical dopants may be implanted into unmasked portions of the semiconductor material layer 10 to form source/drain extension regions (32E, 38E). For example, if the semiconductor material layer 10 includes dopants of a first conductivity type, dopants of a second conductivity type may be implanted into surface portions of the semiconductor material layer 10 to form the source/drain extension regions (32E, 38E). If the first conductivity type is p-type, the second conductivity type is n-type, and vice versa. The source/drain extension regions (32E, 38E) may include a source extension region 32E and a drain extension region 38E. The atomic concentration of dopants of the second conductivity type in the source/drain extension regions (32E, 38E) may be in a range from $1.0 \times 10^{16}/cm^3$ to $5.0 \times 10^{19}/cm^3$, although lesser and greater atomic concentrations may also be used. The depth of the source/drain extension regions (32E, 38E) may be in a range from 5 nm to 50 nm, although lesser and greater depths may also be used. The portion of the semiconductor material layer 10 located between the source extension region 32E and the drain extension region 38E comprises a channel region 35. The channel region 35 underlies the gate dielectric 50. In one embodiment, the control gate electrode 58 is located within an area of the portion of the shallow trench isolation structure 12, and does not extend over the channel region 35. The second photoresist material portion 69 may be subsequently removed, for example, by ashing.

The combination of the control gate electrode 58, the variable-capacitance node dielectric 54, and the intermediate electrode 52 constitutes a variable-capacitance capacitor, or a varactor. The control gate electrode 58 functions as an upper capacitor plate, the variable-capacitance node dielectric 54 functions as a node dielectric that may provide a variable dielectric constant, and the intermediate electrode 52 functions as a lower capacitor plate. Thus, the intermediate electrode 52 straddles over the channel region 35 and a portion of the shallow trench isolation structure 12. The upper capacitor plate comprises the control gate electrode 58 is vertically spaced from the lower capacitor plate, which comprises an intermediate electrode 52. The variable-capacitance node dielectric 54 is located between the lower capacitor plate and the upper capacitor plate, and comprises an electrical-field-programmable metal oxide material providing a variable effective dielectric constant. The electrical-field-programmable metal oxide material may have two dielectric states providing two different effective dielectric constants. A data bit may be stored as a dielectric state of the variable-capacitance node dielectric in the memory device.

At least one dielectric material such as silicon oxide and/or silicon nitride may be conformally deposited over the control gate electrode 58 and the intermediate electrode 52, and may be anisotropically etched to form a dielectric gate spacer 56. Specifically, the at least one dielectric material may be deposited by a conformal deposition process such as a chemical vapor deposition process or an atomic layer deposition process. Horizontal portions of at least one dielectric material may be removed by performing an anisotropic etch process. Remaining vertical portions of the at least one dielectric material constitutes a dielectric gate spacer 56. The lateral thickness of the dielectric gate spacer 56 may be in a range from 5 nm to 100 nm, such as from 10 nm to 50 nm, although lesser and greater lateral thicknesses may also be used. A lower portion of the dielectric gate spacer 56 laterally surrounds a stack of the gate dielectric 50 and the intermediate electrode 52, and an upper portion of the dielectric gate spacer 56 laterally surrounds a stack of the control gate electrode 58 and the variable-capacitance node dielectric 54. In one embodiment, the dielectric gate spacer 56 may include a first opening in which the stack of the control gate electrode 58 and the variable-capacitance node dielectric 54 is located, and a second opening that surrounds the area of the channel region 35.

Figure 5C:
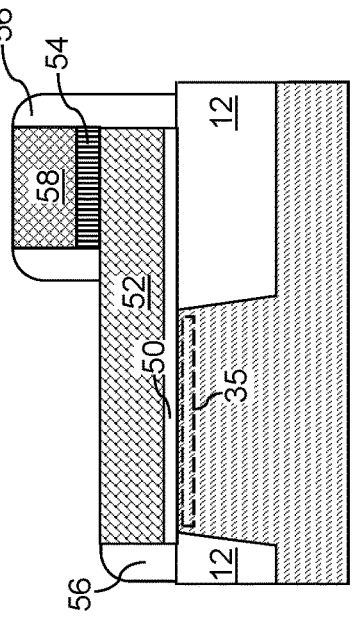
FIG. 5C is a vertical cross-sectional view of the first exemplary structure along the vertical plane C-C' of FIG. 5A.
Figure 5A:
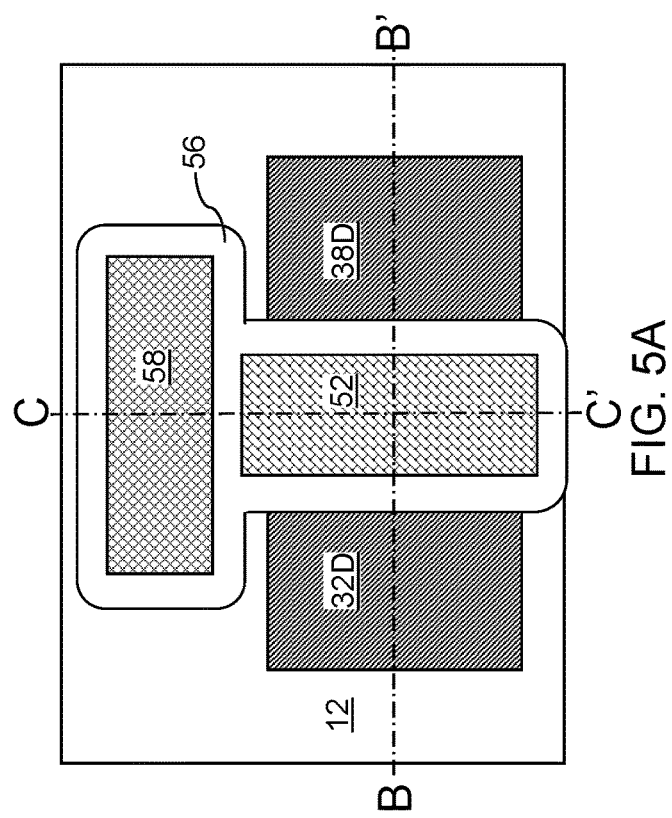
FIG. 5A is a top-down view of the first exemplary structure after formation of source/drain regions according to an embodiment of the present disclosure.
Figure 5B:
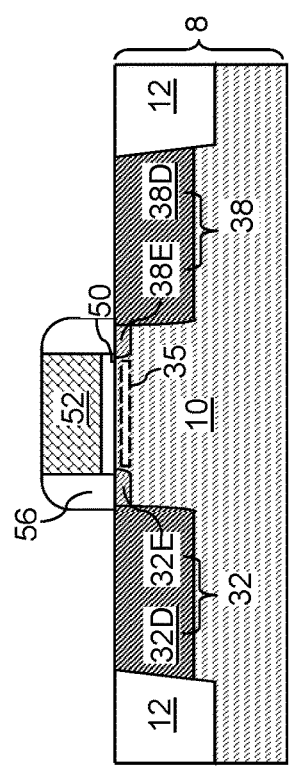
FIG. 5B is a vertical cross-sectional view of the first exemplary structure along the vertical plane B-B' of FIG. 5A.

FIG. 5A is a top-down view of the first exemplary structure after formation of source/drain regions according to an embodiment of the present disclosure. FIG. 5B is a vertical cross-sectional view of the first exemplary structure along the vertical plane B-B' of FIG. 5A. FIG. 5C is a vertical cross-sectional view of the first exemplary structure along the vertical plane C-C' of FIG. 5A. Referring to FIGS. 5A-5C, electrical dopants of the second conductivity type may be implanted into unmasked portions of the semiconductor material layer 10 and the source/drain extension regions (32E, 38E) to form deep source/drain regions (32D, 38D). The deep source/drain regions (32D, 38D) may include a deep source region 32D and a deep drain region 38D. The atomic concentration of dopants of the second conductivity type in the deep source/drain regions (32D, 38D) may be in a range from $5.0 \times 10^{19}/cm^3$ to $2.0 \times 10^{21}/cm^3$, although lesser and greater atomic concentrations may also be used. The depth of the deep source/drain regions (32D, 38D) may be in a range from 20 nm to 200 nm, such as from 40 nm to 100 nm, although lesser and greater depths may also be used. The combination of the source extension region 32E and the deep source region 32D constitutes a source region 32, and the combination of the drain extension region 38E and the deep drain region 38D constitutes a drain region 38.

The shallow trench isolation structure 12 laterally surrounds the device region that includes the source region 32, the drain region 38, and the channel region 35. In one embodiment, the entirety of the upper capacitor plate comprising the control gate electrode 58 is located within the area of the shallow trench isolation structure 12 and outside the device region, i.e., outside the areas of the source region 32, the drain region 38, and the channel region 35. The lower capacitor plate comprising the intermediate electrode 52 further comprises a first portion that overlies the channel region 35 and a second portion that underlies the upper capacitor plate. The entire area of the upper capacitor plate may be located within the area of the lower capacitor plate.

A combination of a field effect transistor and a variable-capacitance capacitor is provided. The variable-capacitance capacitor (52, 54, 58) functions as a composite gate structure for the field effect transistor. The threshold voltage $V_t$ of the field effect transistor is given by: $V_t = V_{FB} 2\phi_F + (4\varepsilon q N_a \phi_F)^{1/2}/C_{total}$, in which $V_{FB}$ is the flat band voltage of the semiconductor material of the channel region 35, $\phi F$ is the Fermi potential of the semiconductor material of the channel region 35, $\varepsilon$ is the permittivity of the semiconductor material of the channel region 35, q is the electrical charge of each charge carrier in the semiconductor material of the channel region 35, $N_a$ is the density of the donor atoms or the acceptor atoms in the semiconductor material of the channel region 35, and $C_{total}$ is the total capacitance between the channel region 35 and an electrode to which a gate voltage is applied. According to an embodiment of the present disclosure, the gate voltage is applied to the control gate electrode. In this embodiment, the total capacitance $C_{total}$ between the channel region 35 and the control gate electrode 58 is the series capacitance of two capacitor structures including the channel region 35, the gate dielectric 50, the intermediate electrode 52, the variable-capacitance node dielectric 54, and the control gate electrode. Thus, a change in the effective dielectric constant of the variable-capacitance node dielectric 54 results in a change in the total capacitance $C_{total}$ between the channel region 35 and the control gate electrode 58, and thus, results in a change in the threshold voltage $V_t$ of the field effect transistor.

Figure 6C:
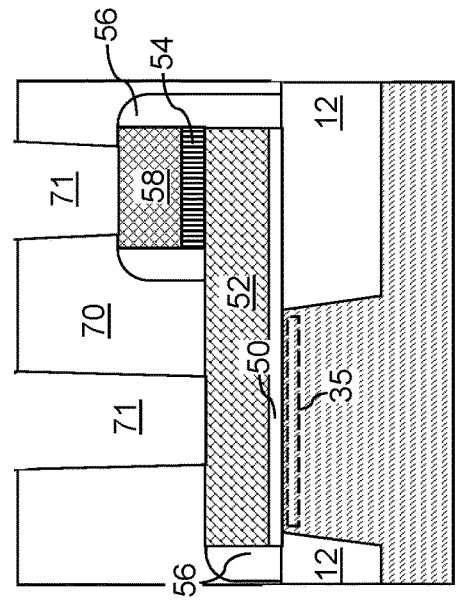
FIG. 6C is a vertical cross-sectional view of the first exemplary structure along the vertical plane C-C' of FIG. 6A.
Figure 6A:
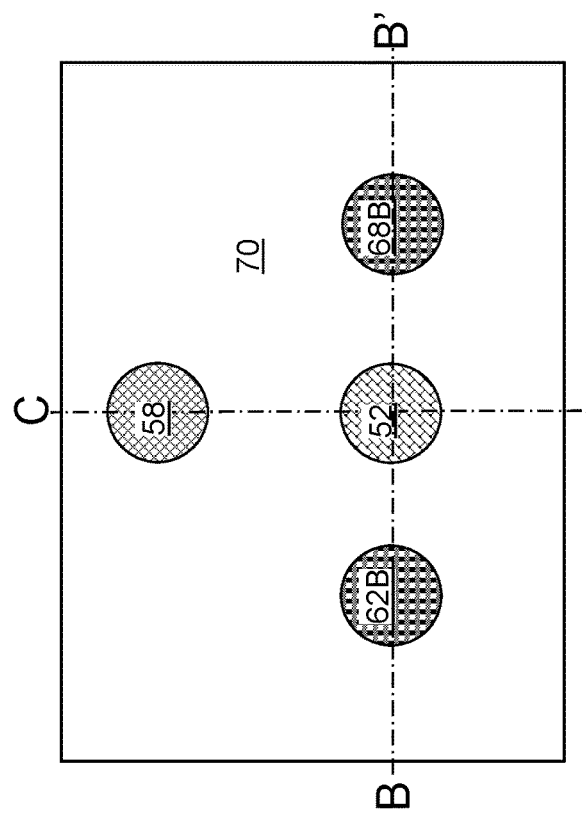
FIG. 6A is a top-down view of the first exemplary structure after formation of a contact-level dielectric layer, contact via cavities, and metal-semiconductor alloy regions according to an embodiment of the present disclosure.
Figure 6B:
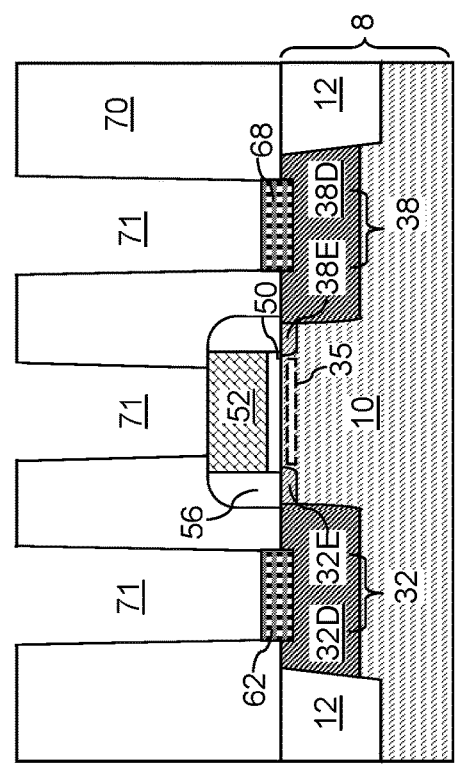
FIG. 6B is a vertical cross-sectional view of the first exemplary structure along the vertical plane B-B' of FIG. 6A.

FIG. 6A is a top-down view of the first exemplary structure after formation of a contact-level dielectric layer, contact via cavities, and metal-semiconductor alloy regions according to an embodiment of the present disclosure. FIG. 6B is a vertical cross-sectional view of the first exemplary structure along the vertical plane B-B' of FIG. 6A. FIG. 6C is a vertical cross-sectional view of the first exemplary structure along the vertical plane C-C' of FIG. 6A. Referring to FIGS. 6A-6C, a dielectric material may be deposited over the field effect transistor incorporating the variable-capacitance capacitor (52, 54, 58) and the shallow trench isolation structure 12. The dielectric material may include a planarizable dielectric material such as undoped silicate glass or a doped silicate glass, or a self-planarizing dielectric material such as flowable oxide (FOX). The dielectric material may be deposited by a chemical vapor deposition process (such as a plasma-enhanced chemical vapor deposition process) or by spin coating. The top surface of the dielectric material may be planarized during, or after, the deposition process. A dielectric material layer having a planar (i.e., horizontal) top surface is formed, through which contact via structures are subsequently formed. As such, the dielectric material layer is herein referred to as a contact-level dielectric layer 70. The top surface of the contact-level dielectric layer 70 may be planar, and may be located above the top surface of the control gate electrode 58. The vertical distance between the top surface of the contact-level dielectric layer 70 and the top surfaces of the control gate electrode 58 may be in a range from 30 nm to 400 nm, although lesser and greater thicknesses may also be used.

A photoresist layer (not shown) may be applied over the contact-level dielectric layer 70, and may be lithographically patterned to form discrete openings therethrough. The openings in the photoresist layer may be formed over the source region 32, the drain region 38, the control gate electrode 58, and a portion of the intermediate electrode 52 that does not underlie the control gate electrode 58. An anisotropic etch process may be performed to form contact via cavities 71 through the contact-level dielectric layer 70. The contact via cavities 71 include a source contact via cavity that extends from the top surface of the contact-level dielectric layer 70 to a top surface of the source region 32, a drain contact via cavity that extends from the top surface of the contact-level dielectric layer 70 to a top surface of the drain region 38, and an intermediate gate contact via cavity that extends from the top surface of the contact-level dielectric layer 70 to a top surface of the intermediate electrode 52, and a control gate contact via cavity that extends from the top surface of the contact-level dielectric layer 70 to a top surface of the control gate electrode 58.

Optionally, a metal that may form a metal-semiconductor alloy may be deposited into the contact via cavities 71 by a conformal or non-conformal deposition process. If the semiconductor material layer 10 comprises, and/or consists essentially of, doped silicon, the metal may be a material that may form a metal silicide. For example, the metal may include nickel, titanium, tungsten, molybdenum, platinum, or another metal that forms a metal silicide. Other suitable metal materials are within the contemplated scope of disclosure. An anneal process may be performed at an elevated temperature to induce formation of a metal silicide material. The elevated temperature may be in a range from 500 degrees Celsius to 750 degrees Celsius. Unreacted portions of the metal may be removed by a wet etch process that etches the metal selective to the metal silicide material. Remaining portions of the metal silicide material may include a source-side metal-semiconductor alloy regions 62 contacting the source region 32, and a drain-side metal-semiconductor alloy regions 68 contacting the drain region 38. In embodiments in which the intermediate electrode 52 includes a semiconductor material, a gate-side metal-semiconductor alloy region may be formed.

FIG. 7A is a top-down view of the first exemplary structure after formation of contact via structures according to an embodiment of the present disclosure. FIG. 7B is a vertical cross-sectional view of the first exemplary structure along the vertical plane B-B' of FIG. 7A. FIG. 7C is a vertical cross-sectional view of the first exemplary structure along the vertical plane C-C' of FIG. 7A. Referring to FIGS. 7A-7C, a metallic liner 72A including diffusion barrier material may be deposited at peripheral portions of the remaining volumes of the contact via cavities 71. The metallic liner 72A includes a conducive metallic nitride material (such as TiN, TaN, or WN) and/or a metallic carbide material (such as TiC, TaC, or WC). Other suitable metallic liner and metallic carbide materials are within the contemplated scope of disclosure. The thickness of the metallic liner 72A may be in a range from 3 nm to 15 nm, although lesser and greater thicknesses may also be used.

A metallic fill material 72B such as Cu, W, Mo, Co, Ru, and/or another elemental metal or an intermetallic alloy may be deposited in remaining volumes of the contact via cavities 71. Other suitable metallic fill materials are within the contemplated scope of disclosure. Portions of the metallic fill material 72B and the metallic liner 72A located above the horizontal plane including the top surface of the contact-level dielectric layer 70 may be removed by a planarization process. Each combination of a remaining portion of the metallic fill material 72B and the metallic liner 72A that fills a respective one of the contact via cavities 71 constitutes a contact via structure (82, 88, 85, 86). The contact via structures (82, 88, 85, 86) include a source contact via structure 82 contacting the source-side metal-semiconductor alloy region 62, a drain contact via structures 88 contacting the drain-side metal-semiconductor alloy region 68, an intermediate gate contact via structures 85 contacting the intermediate electrode 52 (or a gate-side metal-semiconductor alloy region, if present), and a control gate contact via structure 86 contacting the control gate electrode 58. Each of the contact via structures (82, 88, 85, 86) includes a respective metallic liner 72A and a respective portion of the metallic fill material 72B, and may have a top surface within the horizontal plane including the top surface of the contact-level dielectric layer 70.

The combination of the field effect transistor and the variable-capacitance capacitor (52, 54, 58) functions as a memory device that may store a bit as the dielectric state of the variable-capacitance node dielectric 54.

Referring to FIGS. 8A-8C, a second exemplary structure according to an embodiment of the present disclosure is illustrated, which includes a shallow trench isolation structure formed in a semiconductor material layer 10 of a substrate 8. The semiconductor material layer 10 and the shallow trench isolation structure 12 may be the same as in the first exemplary structure as illustrated in FIGS. 1A-7C above.

A sacrificial dielectric layer such as a silicon oxide layer and a sacrificial gate material layer may be formed over the top surface of the substrate 8. The sacrificial dielectric layer and sacrificial gate material layer may be patterned into a gate pattern to form a stack of a sacrificial gate dielectric 450 and a dummy gate structure 452. The sacrificial gate dielectric 450 may include a sacrificial dielectric material such as silicon oxide having a thickness in a range from 1 nm to 30 nm, although thicker or thinner layers may be used. The dummy gate structure 452 includes any sacrificial material that may be removed selective to the materials of the semiconductor material layer 10 and the shallow trench isolation structure 12. For example, the dummy gate structure 452 may include a silicon-germanium alloy, amorphous carbon, diamond-like carbon, borosilicate glass, a silicon-based polymer, etc.

The semiconductor material layer 10 may have a doping of a first conductivity type. Dopants of a second conductivity type can be implanted employing the dummy gate structure 452 as an implantation mask to form a source extension region 32E and a drain extension region 38E, which can have the same depth and the same dopant concentration range as in the first exemplary structure.

Referring to FIGS. 9A-9C, a dummy spacer 456 may be formed around the dummy gate structure 452 by conformal deposition of a sacrificial material layer and an anisotropic etch of the sacrificial material layer. The dummy spacer 456 may include any material that may be employed for the dummy gate structure 452. The material of the dummy spacer 456 may be the same as, or may be different from, the material of the dummy gate structure 452. The thickness of the dummy spacer 456 may be in the same range as the dielectric gate spacer 56 of the first exemplary structure.

Additional dopants of the second conductivity type may be implanted into unmasked portions of the semiconductor material layer 10 and the source/drain extension regions (32E, 38E) to form a deep source region 32D and a deep drain region 38E. The combination of the dummy spacer 456 and the dummy gate structure 452 may be used as an implantation mask. The deep source regions 32D and the deep drain regions 38D may have the same range of dopant concentrations and the same range of depths as in the first exemplary structure. Each combination of a source extension region 32E and a deep source region 32D constitutes a source region 32, and each combination of a drain extension region 38E and a deep drain region 38D constitutes a drain region 38.

Referring to FIGS. 10A-10C, the dummy spacer 456, the dummy gate structure 452, and the sacrificial gate dielectric 450 can be removed selective to the materials of the semiconductor material layer 10 and the shallow trench isolation structure 12 by performing at least one etch process (such as at least one wet etch process) and/or an ashing process. A suitable clean process may be subsequently performed.

Figure 11A:
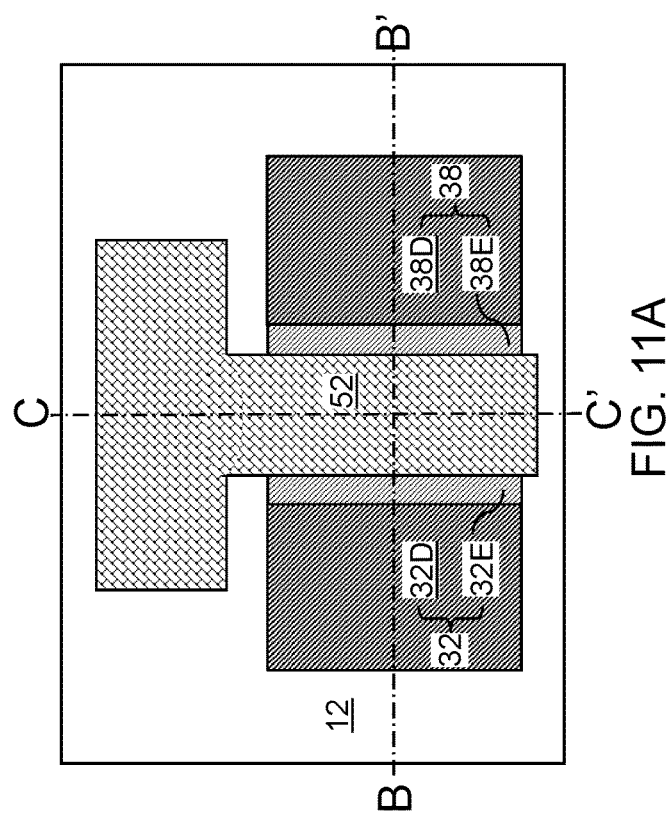
FIG. 11A is a top-down view of the second exemplary structure after formation of a gate dielectric and an intermediate electrode according to an embodiment of the present disclosure.
Figure 11C:
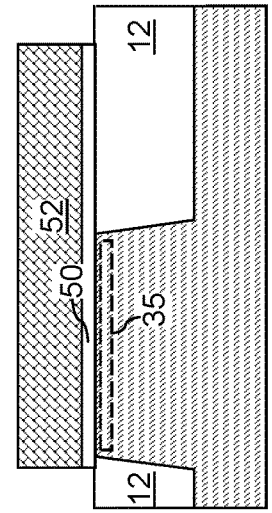
FIG. 11C is a vertical cross-sectional view of the second exemplary structure along the vertical plane C-C' of FIG. 11A.
Figure 11B:
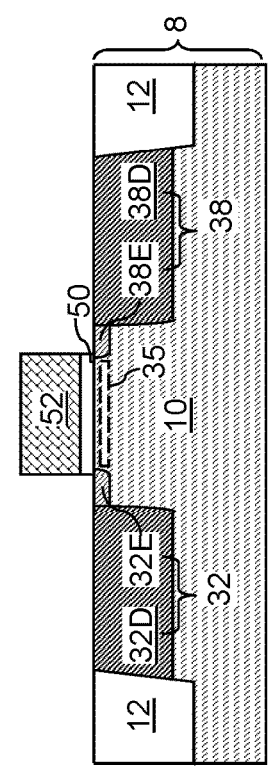
FIG. 11B is a vertical cross-sectional view of the second exemplary structure along the vertical plane B-B' of FIG. 11A.

Referring to FIGS. 11A-11C, a gate dielectric material layer and an intermediate electrode material layer may be deposited. The gate dielectric material layer and the intermediate electrode material layer may be patterned into a gate electrode pattern to form a gate dielectric 50 and an intermediate electrode 52. A patterned photoresist layer may be formed over the intermediate electrode material layer. An anisotropic etch process may be employed to transfer the pattern in the photoresist layer through the intermediate electrode material layer and the gate dielectric material layer. The pattern of the patterned photoresist layer may be the same as the pattern of the intermediate electrode 52 in the first exemplary structure as illustrated above with reference to FIGS. 1A-7C. The gate dielectric 50 may include the same material and may have a same thickness range as in the first exemplary structure. The intermediate electrode 52 may include the same material and may have a same thickness range as in the first exemplary structure.

Figure 12C:
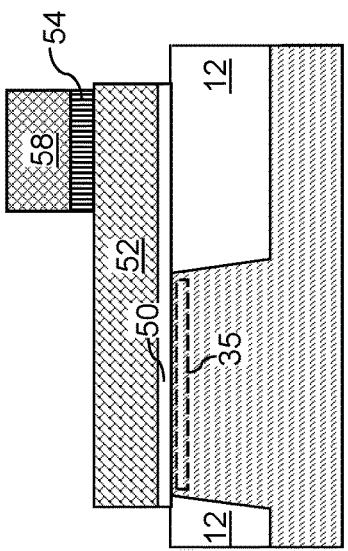
FIG. 12C is a vertical cross-sectional view of the second exemplary structure along the vertical plane C-C' of FIG. 12A.
Figure 12A:
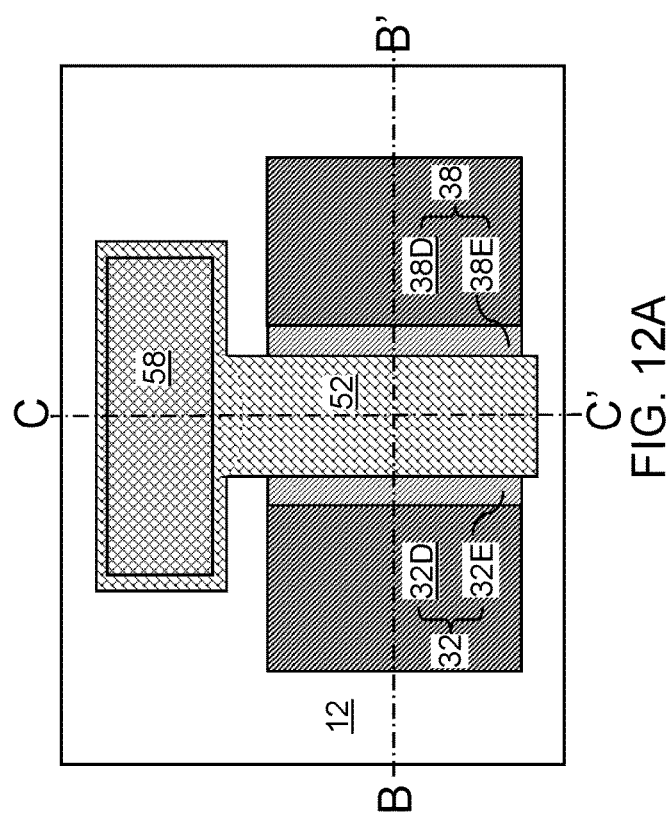
FIG. 12A is a top-down view of the second exemplary structure after formation of a variable-capacitance node dielectric and a control gate electrode according to an embodiment of the present disclosure.
Figure 12B:
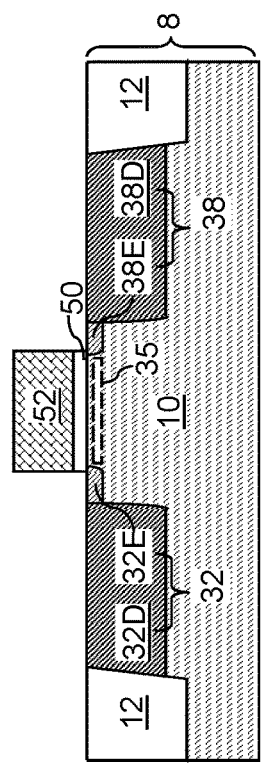
FIG. 12B is a vertical cross-sectional view of the second exemplary structure along the vertical plane B-B' of FIG. 12A.

Referring to FIGS. 12A-12C, a variable-capacitance node dielectric material layer and a control gate electrode material layer may be deposited. The variable-capacitance node dielectric material layer and the control gate electrode material layer may be patterned into a variable-capacitance node dielectric 54 and a control gate electrode 58. A patterned photoresist layer may be formed over the control gate electrode material layer. An anisotropic etch process may be employed to transfer the pattern in the photoresist layer through the control gate electrode material layer and the variable-capacitance node dielectric material layer. The pattern of the patterned photoresist layer may be the same as the pattern of control gate electrode 58 in the first exemplary structure (see e.g., FIG. 2A-2C). The variable-capacitance node dielectric 54 may include the same material and can have a same thickness range as in the first exemplary structure. The control gate electrode 58 may include the same material and can have a same thickness range as in the first exemplary structure.

Figure 13A:
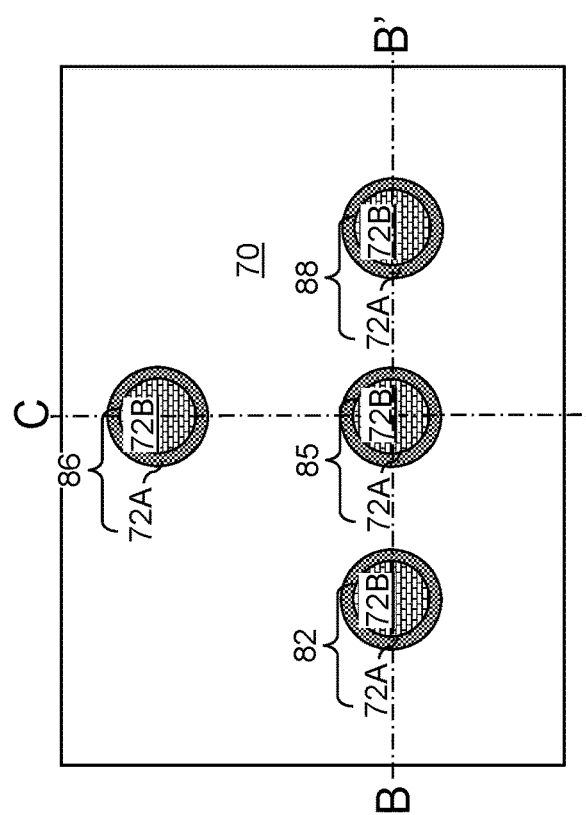
FIG. 13A is a top-down view of the second exemplary structure after formation of a contact-level dielectric layer, metal-semiconductor alloy regions, and contact via structures according to an embodiment of the present disclosure.
Figure 13C:
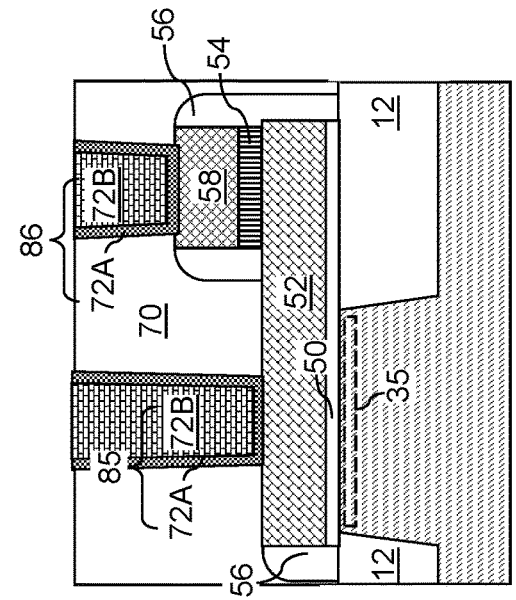
FIG. 13C is a vertical cross-sectional view of the second exemplary structure along the vertical plane C-C' of FIG. 13A.
Figure 13B:
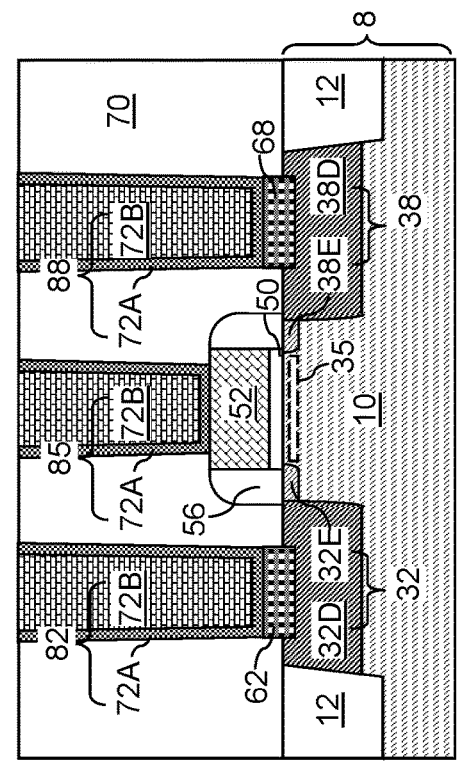
FIG. 13B is a vertical cross-sectional view of the second exemplary structure along the vertical plane B-B' of FIG. 13A.

Referring to FIGS. 13A-13C, a dielectric gate spacer 56 may be optionally formed by conformal deposition and anisotropic etching a dielectric gate spacer material layer. The dielectric gate spacer 56 may include the same material as, and may have the same lateral thickness as, in the first exemplary structure. Subsequently, the processing steps of FIGS. 6A-7C can be performed to form a contact-level dielectric layer 70, metal-semiconductor alloy regions (62, 68), and contact via structures (82, 85, 88, 86).

Generally speaking, various other types of field effect transistors may be employed to provide the semiconductor device of the present disclosure, which may be a fin field effect transistor, a gate all around field effect transistor, a nanowire field effect transistor, a vertical field effect transistor, or any other type of field effect transistor. In each embodiment, a gate dielectric 50 and an intermediate gate electrode 52 may be formed on the entirety of a channel surface overlying a channel region 35, and a stack of a variable-capacitance node dielectric 54 and a control gate electrode 58 can be formed on a portion of the intermediate gate electrode 52. Another portion of the intermediate gate electrode 52 may be contacted by an intermediate gate contact via structures 85.

FIGS. 14A-18C illustrate a third exemplary structure in which a fin field effect transistor may be formed in lieu of a planar field effect transistor.

Referring to FIGS. 14A-14C, a semiconductor fin 720 may be provided over a substrate 8 including an insulating substrate layer 710. In one embodiment, the semiconductor fin 720 may be a patterned portion of a top semiconductor layer of a semiconductor-on-insulator (SOI) substrate. The insulating substrate layer 720 may be the buried oxide layer of the SOI substrate. Alternatively, the semiconductor fin 720 may be a portion of a semiconductor material layer that is bonded to the insulating substrate layer 710, and is subsequently patterned. For example, a single crystalline silicon substrate with a hydrogen implantation layer therein may be bonded to the insulating substrate layer 710, and can be subsequently cleaved to remove a bulk portion of the single crystalline silicon substrate. The remaining thin surface portion of the single crystalline silicon substrate may be patterned to form the semiconductor fin 720. While the present disclosure is described using an embodiment in which the semiconductor fin 720 is provided on an insulating substrate layer 710, embodiments are expressly contemplated herein in which the semiconductor fin 720 may be formed on a top surface of a semiconductor material layer, and an underlying portion of the semiconductor material layer is suitable electrically isolated by a combination of shallow trench isolation structures and multiple doped wells with reverse biases thereamongst. The semiconductor fin 720 may be single crystalline or polycrystalline. The height of the semiconductor fin 720 may be in a range from 50 nm to 500 nm, although lesser and greater heights may also be used. The semiconductor fin 720 may have a doping of a first conductivity type. The atomic concentration of dopants in the semiconductor fin 720 may be in a range from $1.0 \times 10^{14}/cm^3$ to $3.0 \times 10^{17}/cm^3$, although lesser and greater atomic concentrations may also be employed. The width of the semiconductor fin 720 may be in a range from 10 nm to 80 nm, although lesser and greater widths may also be employed.

Figure 15C:
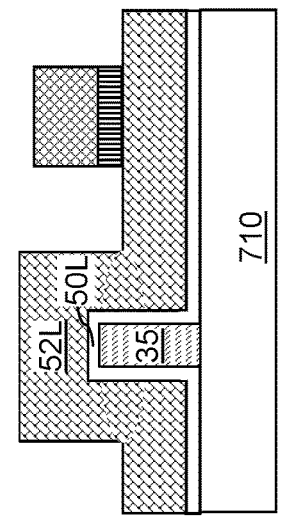
FIG. 15C is a vertical cross-sectional view of the third exemplary structure along the vertical plane C-C' of FIG. 15A.
Figure 15A:
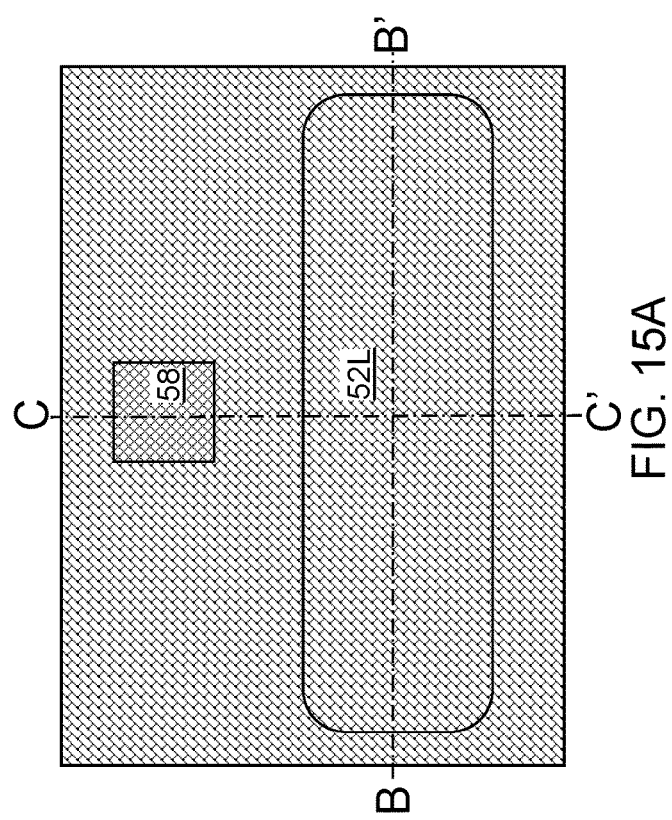
FIG. 15A is a top-down view of the third exemplary structure after formation of a gate dielectric, an intermediate gate electrode, a source extension region, and a drain extension region according to an embodiment of the present disclosure.
Figure 15B:
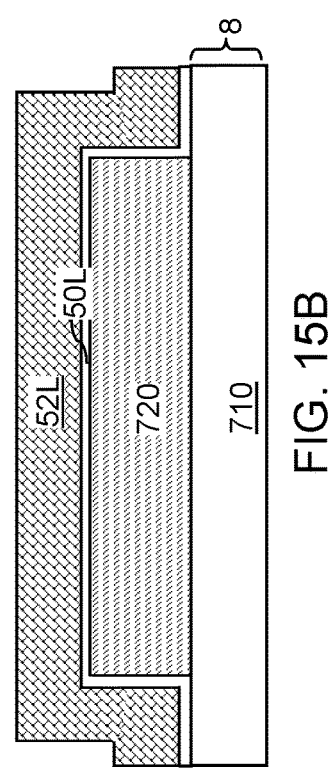
FIG. 15B is a vertical cross-sectional view of the third exemplary structure along the vertical plane B-B' of FIG. 15A.

Referring to FIGS. 15A-15C, the processing steps of FIGS. 1A-1C discussed above, may be performed to sequentially deposit a gate dielectric material layer 50L, an intermediate electrode material layer 52L, a variable-capacitance node dielectric material layer, and a control gate electrode material layer. The material composition and the thickness of each layer may be the same as in the first exemplary structure.

A photoresist layer (not shown) may be applied over the control gate electrode material layer. The photoresist layer may be lithographically patterned to form a gate pattern that covers a portion of the control gate electrode material layer that is laterally offset from a middle portion of the semiconductor fin 720. An anisotropic etch process may be performed to etch unmasked portions of the control gate electrode material layer and the variable-capacitance node dielectric material layer. A patterned portion of the control gate electrode material layer comprises a control gate electrode 58. A patterned portion of the variable-capacitance node dielectric material layer comprises a variable-capacitance node dielectric 54. The control gate electrode 58 and the variable-capacitance node dielectric 54 may have vertically coincident sidewalls, i.e., sidewalls that are located within a common vertical plane. The photoresist layer can be subsequently removed, for example, by ashing.

Referring to FIGS. 16A-16C, the processing steps of FIGS. 3A-3C described above may be performed to pattern the gate dielectric material layer 50L and the intermediate electrode material layer 52L. A patterned photoresist layer may be used as an etch mask layer during an anisotropic etch process that patterns the gate dielectric material layer 50L and the intermediate electrode material layer 52L into a gate dielectric 50 and an intermediate electrode 52. The gate dielectric 50 and the intermediate electrode 52 straddle a middle portion of the semiconductor fin 720, and underlie the stack of the control gate electrode 58 and the variable-capacitance node dielectric 54. The dimension of the intermediate electrode 52 along the lengthwise direction of the semiconductor fin 720 is the gate length of the fin field effect transistor.

An ion implantation process may be performed using the intermediate electrode 52 as an implantation mask structure to implant dopants of a second conductivity type into unmasked portions of the semiconductor fin 720. The second conductivity type is the opposite of the first conductivity type. A source extension region 32E and a drain extension region 38E may be formed in the implanted portions of the semiconductor fin 720. The un-implanted portion of the semiconductor fin 720 that underlie the intermediate electrode 52 constitutes a channel region 35. The atomic concentration of dopants of the second conductivity type in the source extension region 32E and in the drain extension region 38E may be the same as in the first exemplary structure.

Figure 17C:
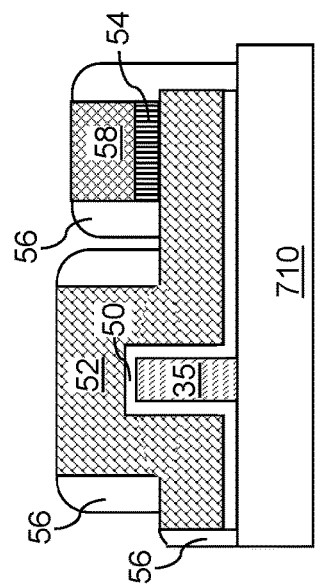
FIG. 17C is a vertical cross-sectional view of the third exemplary structure along the vertical plane C-C' of FIG. 17A.
Figure 17A:
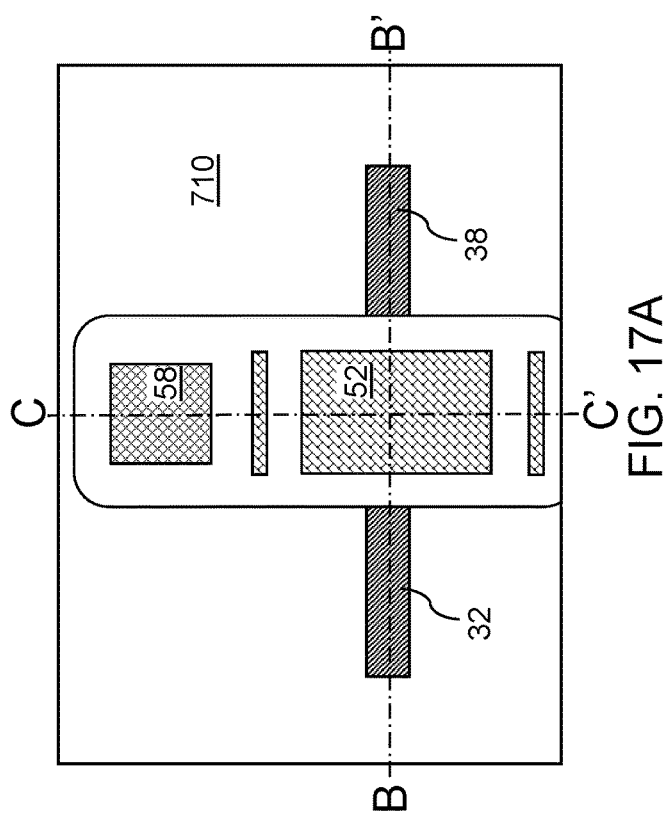
FIG. 17A is a top-down view of the third exemplary structure after formation a dielectric gate spacer and deep source/drain regions according to an embodiment of the present disclosure.
Figure 17B:
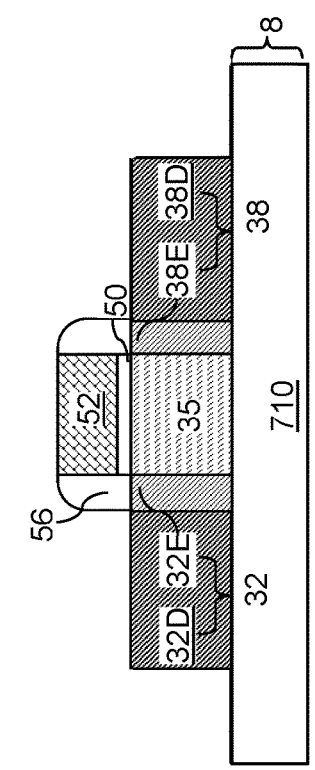
FIG. 17B is a vertical cross-sectional view of the third exemplary structure along the vertical plane B-B' of FIG. 17A.

Referring to FIGS. 17A-17C, the processing steps of FIGS. 5A-5C described above may be performed to form a dielectric gate spacer 56, a deep source region 32D, and a deep drain region 38D. The dielectric gate spacer 56 may include the same material, and may have the same thickness range, as in the first exemplary structure. The deep source region 32D and the deep drain region 38D may be performed by implanting dopants of the second conductivity type employing the combination of the intermediate electrode 52 and the dielectric gate spacer 56 as an implantation mask. The deep source region 32D and the deep drain region 38D may have the same range of atomic concentration of dopants of the second conductivity type as in the first exemplary structure. Each combination of a source extension region 32E and a deep source region 32D constitutes a source region 32, and each combination of a drain extension region 38E and a deep drain region 38D constitutes a drain region 38.

Figure 18C:
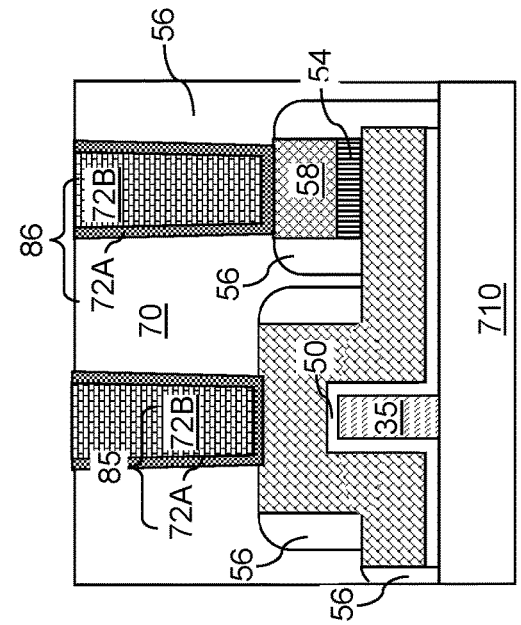
FIG. 18C is a vertical cross-sectional view of the third exemplary structure along the vertical plane C-C' of FIG. 18A.
Figure 18A:
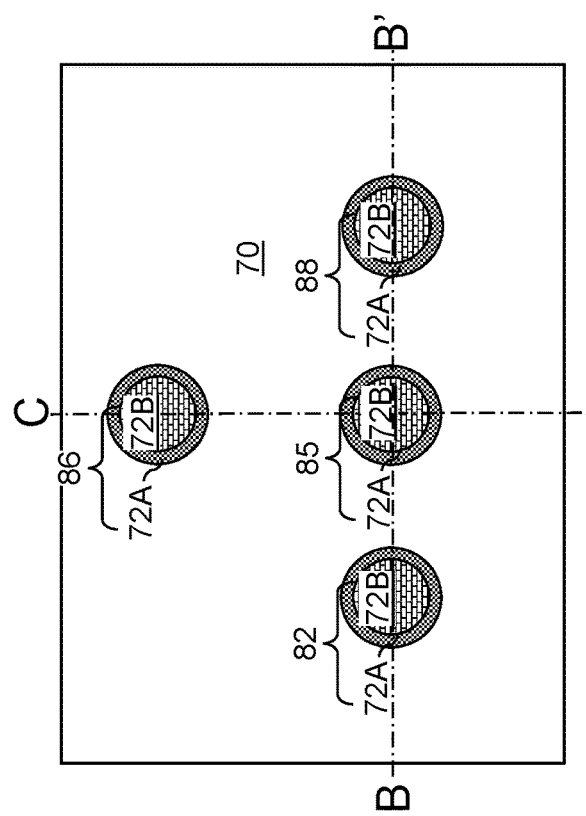
FIG. 18A is a top-down view of the third exemplary structure after formation of a contact-level dielectric layer, metal-semiconductor alloy regions, and contact via structures according to an embodiment of the present disclosure.
Figure 18B:
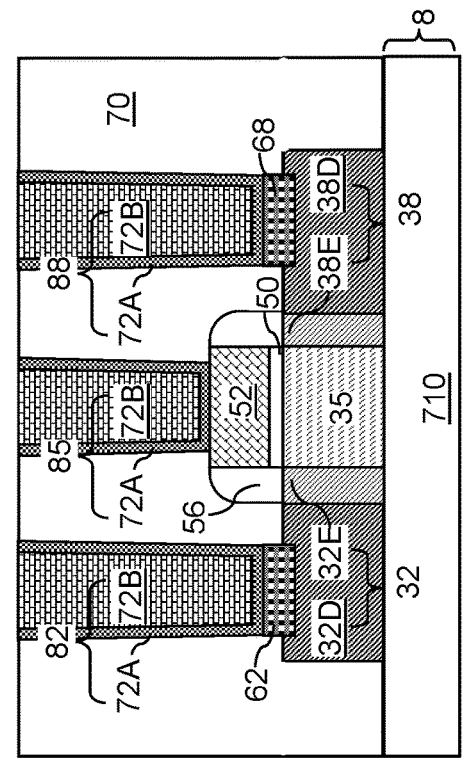
FIG. 18B is a vertical cross-sectional view of the third exemplary structure along the vertical plane B-B' of FIG. 18A.

Referring to FIGS. 18A-18C, the processing steps of FIGS. 6A-7C can be performed to form a contact-level dielectric layer 70, metal-semiconductor alloy regions (62, 68), and contact via structures (82, 85, 88, 86).

Figure 19:
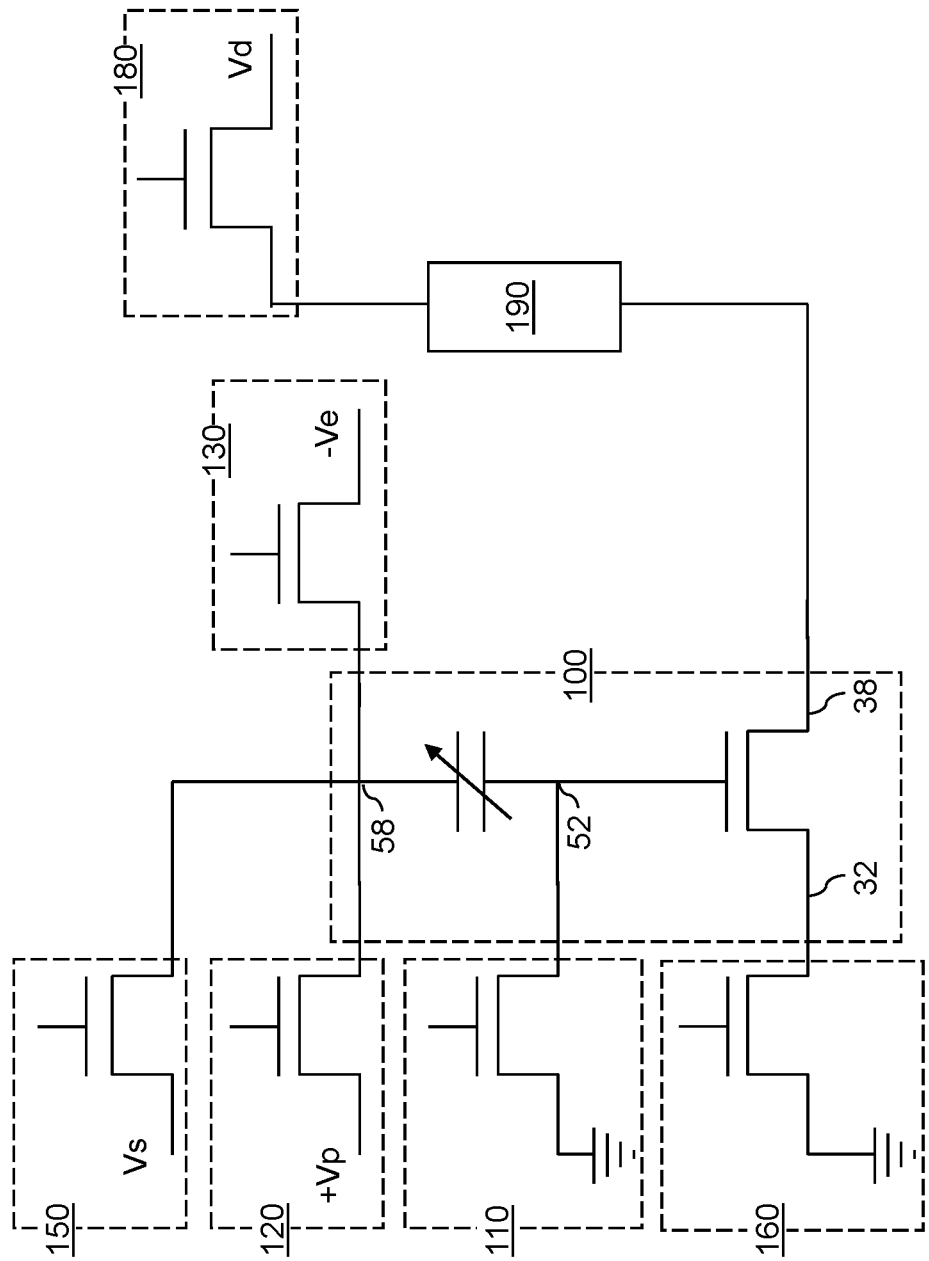
FIG. 19 is a circuit schematic of a combination of a memory device and a control circuit according to an embodiment of the present disclosure.

FIG. 19 illustrates a circuit schematic for a combination of the memory device 100 (comprising the combination of the field effect transistor and the variable-capacitance capacitor (52, 54, 58)) and a control circuit according to an embodiment of the present disclosure. The memory device 100 includes the field effect transistor and the variable-capacitance capacitor (52, 54, 58). The field effect transistor comprises a gate structure (50, 52) comprising a gate dielectric 50 and an intermediate electrode 52, and the variable-capacitance capacitor (52, 54, 58) comprises a lower capacitor plate comprising the intermediate electrode 52, an upper capacitor plate comprising a control gate electrode 58, and a variable-capacitance node dielectric 54 located between the lower capacitor plate and the upper capacitor plate. The threshold voltage of the field effect transistor while the intermediate electrode 52 is electrically floating is dependent on the dielectric state of the variable-capacitance node dielectric 54. The threshold voltage of the field effect transistor while the intermediate electrode 52 is electrically floating is the minimum voltage that needs to be applied to the control gate electrode 58 while the intermediate electrode 52 is electrically floating in order to turn on the field effect transistor.

The dielectric state of the variable-capacitance node dielectric 54 may be programmed into a state that is selected from a first dielectric state (e.g., a program state) providing a first capacitance to the variable-capacitance capacitor (52, 54, 58) and a second dielectric state (e.g., an erase state) providing a second capacitance to the variable-capacitance capacitor (52, 54, 58). For example, the dielectric state of the variable-capacitance node dielectric 54 may be programmed into the first dielectric state by applying a first voltage having a first polarity to the control gate electrode 58 relative to the intermediate electrode 52, or may be programmed into the second dielectric state by applying a second voltage having a second polarity to the control gate electrode 58 relative to the intermediate electrode 52. The second polarity may be the opposite of the first polarity.

Application of the first voltage or the second voltage may be effected by a programming circuit (120, 110) or by an erase circuit (130, 110). The programming circuit (120, 110) is configured to apply a programming voltage having the first polarity to the control gate electrode 58 relative to the intermediate electrode 52. The erase circuit (130, 110) may be configured to apply an erase voltage having the second polarity to the control gate electrode 58 relative to the intermediate electrode 52. The second polarity is an opposite of the first polarity. For example, if the first polarity is positive, the second polarity is negative, and vice versa.

In an illustrative example, the programming circuit (120, 110) may include a programming-voltage connection switch 120 that may comprise a field effect transistor. One of the source/drain regions of the field effect transistor of the programming-voltage connection switch 120 may be electrically connected to the control gate electrode 58, and another of the source/drain regions of the field effect transistor of the programming-voltage connection switch 120 may be electrically connected to a voltage source that provides a programming voltage +Vp, which may be the first voltage. The programming circuit (120, 110) may include a grounding switch 110 connected to the intermediate electrode 52 and configured to provide to the intermediate electrode 52 a state selected from a first state in which the intermediate electrode 52 is electrically floating (i.e., an electrically floating state), and a second state in which the intermediate electrode is electrically grounded (i.e., a grounded state). In one embodiment, the programming voltage +Vp may have a magnitude in a range from 2 V to 10 V, such as from 3 V to 10 V, although lesser and greater magnitudes may also be used.

The erase circuit (130, 110) may include an erase-voltage connection switch 130 that may comprise a field effect transistor. One of the source/drain regions of the field effect transistor of the erase-voltage connection switch 130 may be electrically connected to the control gate electrode 58, and another of the source/drain regions of the field effect transistor of the erase-voltage connection switch 130 may be electrically connected to a voltage source that provides an erase voltage −Ve, which may be the second voltage. The erase circuit (130, 110) may include the grounding switch 110. In one embodiment, the erase voltage −Ve may have a magnitude in a range from 2 V to 10 V, such as from 3 V to 10 V, although lesser and greater magnitudes may also be used.

Generally, the variable-capacitance node dielectric 54 of the variable-capacitance capacitor (52, 54, 58) may have a variable effective dielectric constant that depends on the hysteresis effect of the electrical field across the upper capacitor plate (comprising the control gate electrode 58) and the lower capacitor plate (comprising the intermediate electrode 52). The variable-capacitance node dielectric 54 may be programmed into the first state or the second state by applying an electrical field across the upper capacitor plate and the lower capacitor plate. To perform a program operation, the programming-voltage connection switch 120 and the grounding switch 110 are turned on. During the program operation, a programming voltage having the first polarity is applied to the control gate electrode 58 relative to the intermediate electrode 52. To perform an erase operation, the erase-voltage connection switch 130 and the grounding switch 110 are turned on. During the erase operation, an erase voltage having the second polarity may be applied to the control gate electrode 58 relative to the intermediate electrode 52.

In one embodiment, the variable-capacitance node dielectric 54 comprises, and/or consists essentially of, a metal oxide material that provides reversible electrical field-dependent resistivity modulation, and the first dielectric state and the second dielectric state provide different electrical resistivities for the metal oxide material of the variable-capacitance node dielectric 54. The ratio of the electrical resistivity of the first electrical state to the electrical resistivity of the second electrical state may be in a range from $1.0 \times 10^{-10}$ to $\frac{1}{3}$ or in a range from 3 to $1.0 \times 10^{10}$, although different ratios may also be used. In one embodiment, the variable-capacitance node dielectric 54 comprises, and/or consists essentially of, a resistivity-modulated metal oxide material, and the control gate electrode 58 comprises, and/or consists essentially of, a transition metal having a melting point higher than 1,000 degrees Celsius or a conductive metallic nitride material. In one embodiment, the oxygen vacancy distribution within the variable-capacitance node dielectric 54 may be changed during programming of the dielectric state of the variable-capacitance node dielectric 54.

In one embodiment, the variable-capacitance node dielectric 54 comprises, and/or consists essentially of, a metal oxide material that provides reversible electrical field-dependent movement of metal atoms therein. In this embodiment, the control gate electrode 58 may comprise, and/or may consist essentially of, a conductive bridge metallic material selected from copper, a copper-containing compound or intermetallic alloy, tellurium, a tellurium-containing compound or intermetallic alloy, aluminum, and an aluminum-containing compound or intermetallic alloy. Other suitable metallic materials are within the contemplated scope of disclosure. The electrical resistivity within the variable-capacitance node dielectric 58 may be changed during programming of the dielectric state of the variable-capacitance node dielectric 54.

The memory device may include a sense circuit (150, 110, 160, 180, 190). The sense circuit (150, 110, 160, 180, 190) may be configured to apply a voltage bias across the drain region 38 and the source region 32, and to apply a sensing gate voltage Vs to the control gate electrode 58 during the sensing step. The field effect transistor may have a first threshold voltage while the variable-capacitance node dielectric 58 is under the first dielectric state, and may have a second threshold voltage while the variable-capacitance node dielectric 58 is under the second dielectric state. The sensing gate voltage Vs may be between the first threshold voltage and the second threshold voltage.

In one embodiment, the sense circuit (150, 110, 160, 180, 190) may include a sense gate voltage switch 150 configured to apply the sensing gate voltage Vs to the control gate electrode 58 during the sense operation, a source grounding switch 160 configured to electrically ground the source region 32 during the sense operation, a drain bias switch 180 configured to apply a drain bias voltage Vd to the drain region 38 during the sense operation, and a current sensing circuit 190 configured to measure the current that flows between the source region 32 and the drain region 38 during the sense operation. The sense circuit (150, 110, 160, 180, 190) includes the grounding switch 110, which is configured to provide the first state (i.e., the electrically floating state) to the intermediate electrode 52 during the sensing operation, and to provide the second state (i.e., the electrically grounded state) to the intermediate electrode 52 during the programming operation or during the erase operation.

Figure 20:
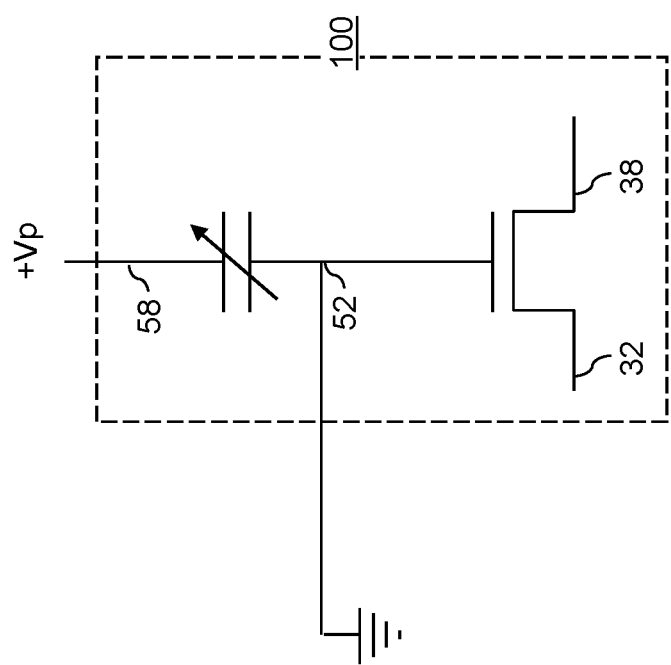
FIG. 20 is a circuit schematic of an active portion of the combination of the memory device and the control circuit of FIG. 19 during a programming operation according to an embodiment of the present disclosure.

Referring to FIG. 20, an equivalent circuit schematic for the circuit schematic of FIG. 8 is illustrated during the programming operation. The programming voltage +Vp is applied to the control gate electrode 58, and the intermediate electrode 52 may be electrically grounded to program the intermediate electrode 52 into the first dielectric state. The field effect transistor is turned off because the intermediate electrode is electrically grounded.

Figure 21:
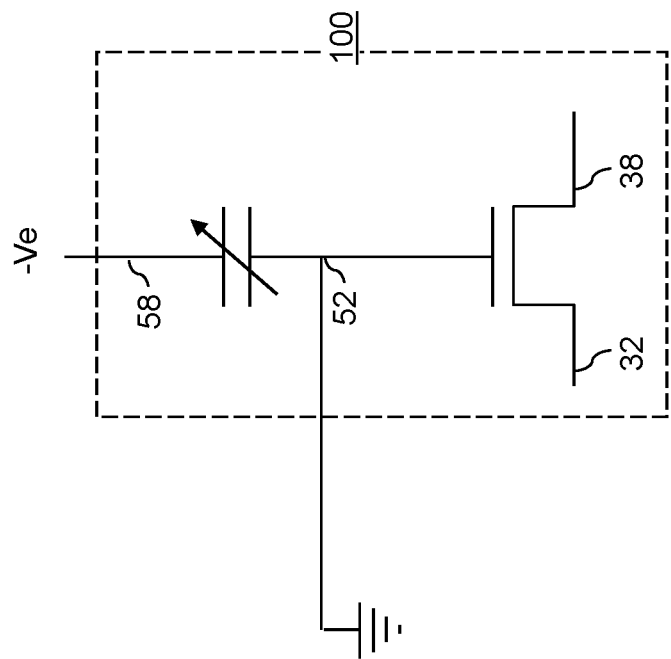
FIG. 21 is a circuit schematic of an active portion of the combination of the memory device and the control circuit of FIG. 19 during an erase operation according to an embodiment of the present disclosure.

Referring to FIG. 21, an equivalent circuit schematic for the circuit schematic of FIG. 19 is illustrated during the erase operation. The erase voltage −Ve is applied to the control gate electrode 58, and the intermediate electrode 52 may be electrically grounded to program the intermediate electrode 52 into the first dielectric state. The field effect transistor is turned off because the intermediate electrode is electrically grounded.

Figure 22:
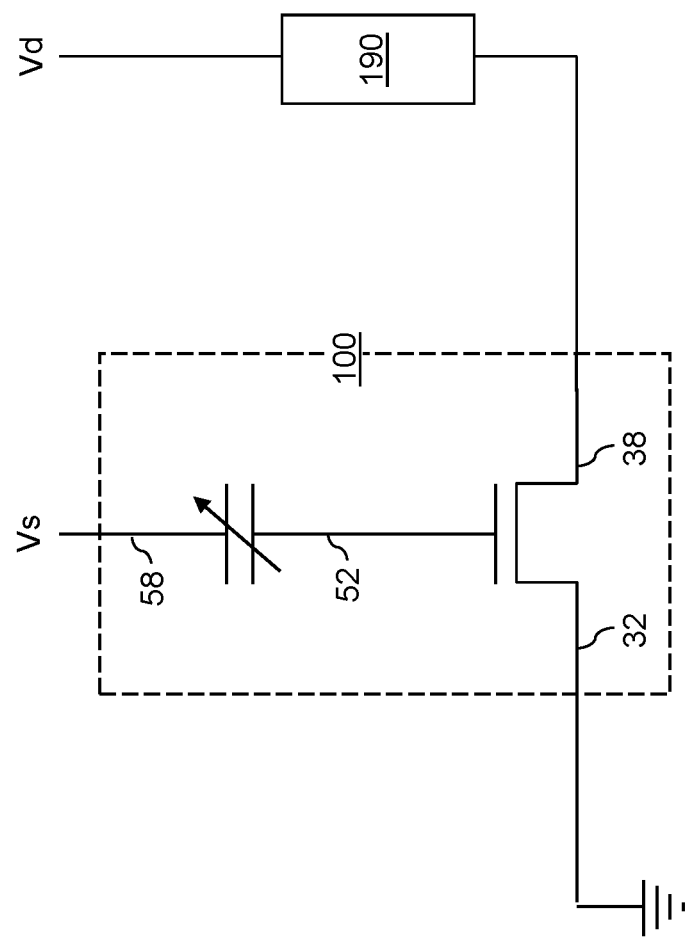
FIG. 22 is a circuit schematic of an active portion of the combination of the memory device and the control circuit of FIG. 19 during a sensing operation according to an embodiment of the present disclosure.

Referring to FIG. 22, an equivalent circuit schematic for the circuit schematic of FIG. 19 is illustrated during the sensing operation. The sensing gate voltage Vs is applied to the control gate electrode 58, and the intermediate electrode 52 may be electrically floating. The drain bias switch 180 is turned on and applies the drain bias voltage Vd to the drain region 38, and the source grounding switch 160 is turned on and electrically grounds the source region 32. The current sensing circuit 190 measures the current that flows between the source region 32 and the drain region 38 during the sense operation. In one embodiment, the magnitudes of the first threshold voltage, the second threshold voltage, and the sensing gate voltage may be not greater than 5 V, and/or may be in a range from 2 V to 5 V.

In embodiments in which the first threshold voltage is lower than the second threshold voltage, the sensing gate voltage Vs is higher than the first threshold voltage and is lower than the second threshold voltage. In this embodiment, if the current sensing circuit 190 detects flow of electrical current during the sensing operation, the variable-capacitance node dielectric 54 is in the first dielectric state, and if the current sensing circuit 190 does not detect flow of electrical current during the sensing operation, the variable-capacitance node dielectric 54 is in the second dielectric state.

Conversely, in embodiments in which the first threshold voltage is higher than the second threshold voltage, the sensing gate voltage Vs is lower than the first threshold voltage and is higher than the second threshold voltage. In this embodiment, if the current sensing circuit 190 detects flow of electrical current during the sensing operation, the variable-capacitance node dielectric 54 is in the second dielectric state, and if the current sensing circuit 190 does not detect flow of electrical current during the sensing operation, the variable-capacitance node dielectric 54 is in the first dielectric state.

Figure 23:
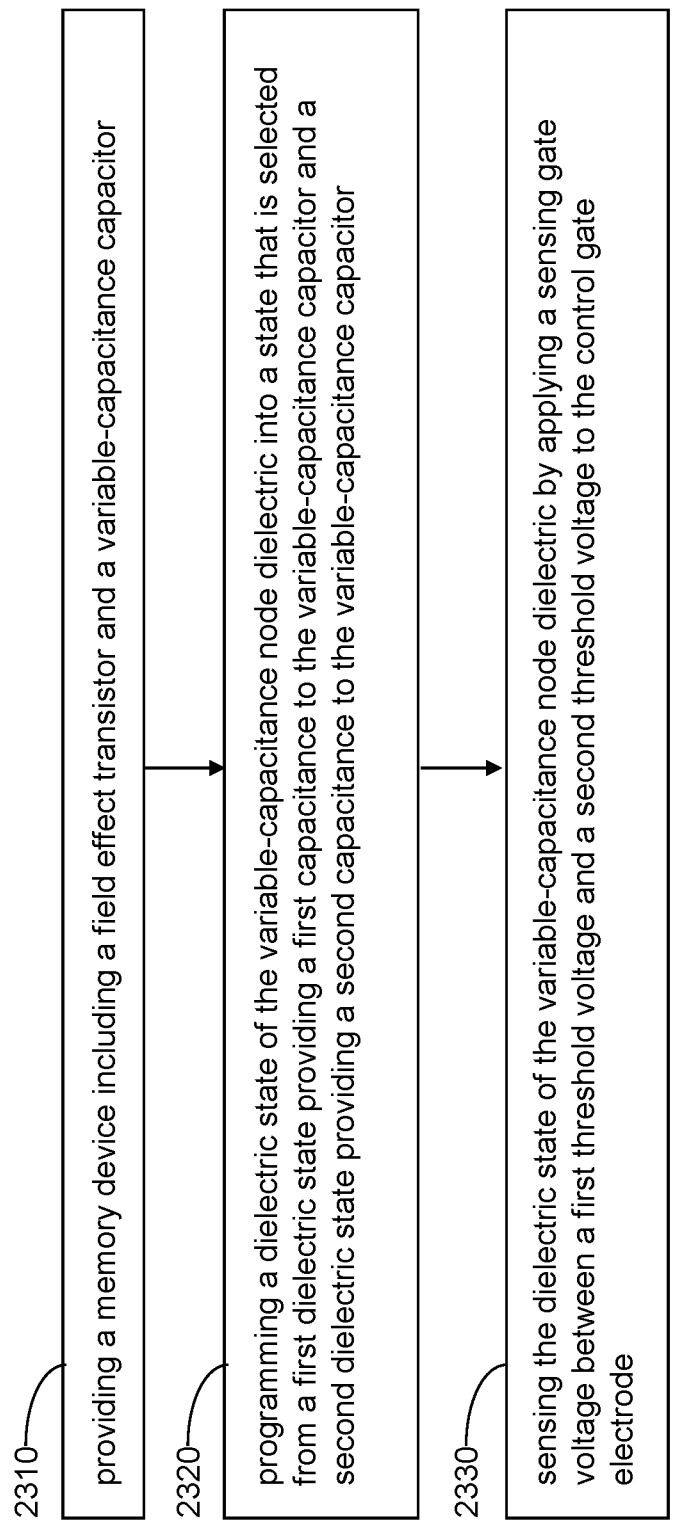
FIG. 23 is a flowchart illustrating steps for operating a memory device of the present disclosure according to an embodiment of the present disclosure.

Referring to FIG. 23, a flowchart illustrates operational steps for operating a memory device of the present disclosure according to an embodiment of the present disclosure.

Referring to step 2310 and FIGS. 1A-18C, a memory device is provided, which includes a field effect transistor and a variable-capacitance capacitor (52, 54, 58). The field effect transistor comprises a gate structure (50, 52) comprising a gate dielectric 50 and an intermediate electrode 52, and the variable-capacitance capacitor (52, 54, 58) comprises a lower capacitor plate comprising the intermediate electrode 52, an upper capacitor plate comprising a control gate electrode 58, and a variable-capacitance node dielectric 54 located between the lower capacitor plate and the upper capacitor plate. A threshold voltage (for the control gate electrode 58) of the field effect transistor while the intermediate electrode 52 is electrically floating is dependent on a dielectric state of the variable-capacitance node dielectric 54.

Referring to step 2320 and FIGS. 19, 20, and 21, the dielectric state of the variable-capacitance node dielectric 54 may be programmed into a state that is selected from a first dielectric state providing a first capacitance to the variable-capacitance capacitor (52, 54, 58) and a second dielectric state providing a second capacitance to the variable-capacitance capacitor (52, 54, 58). Referring to step 2330 and FIGS. 19 and 22, the dielectric state of the variable-capacitance node dielectric 54 may be sensed by applying a sensing gate voltage Vs between the first threshold voltage and the second threshold voltage to the control gate electrode 58.

Figure 24:
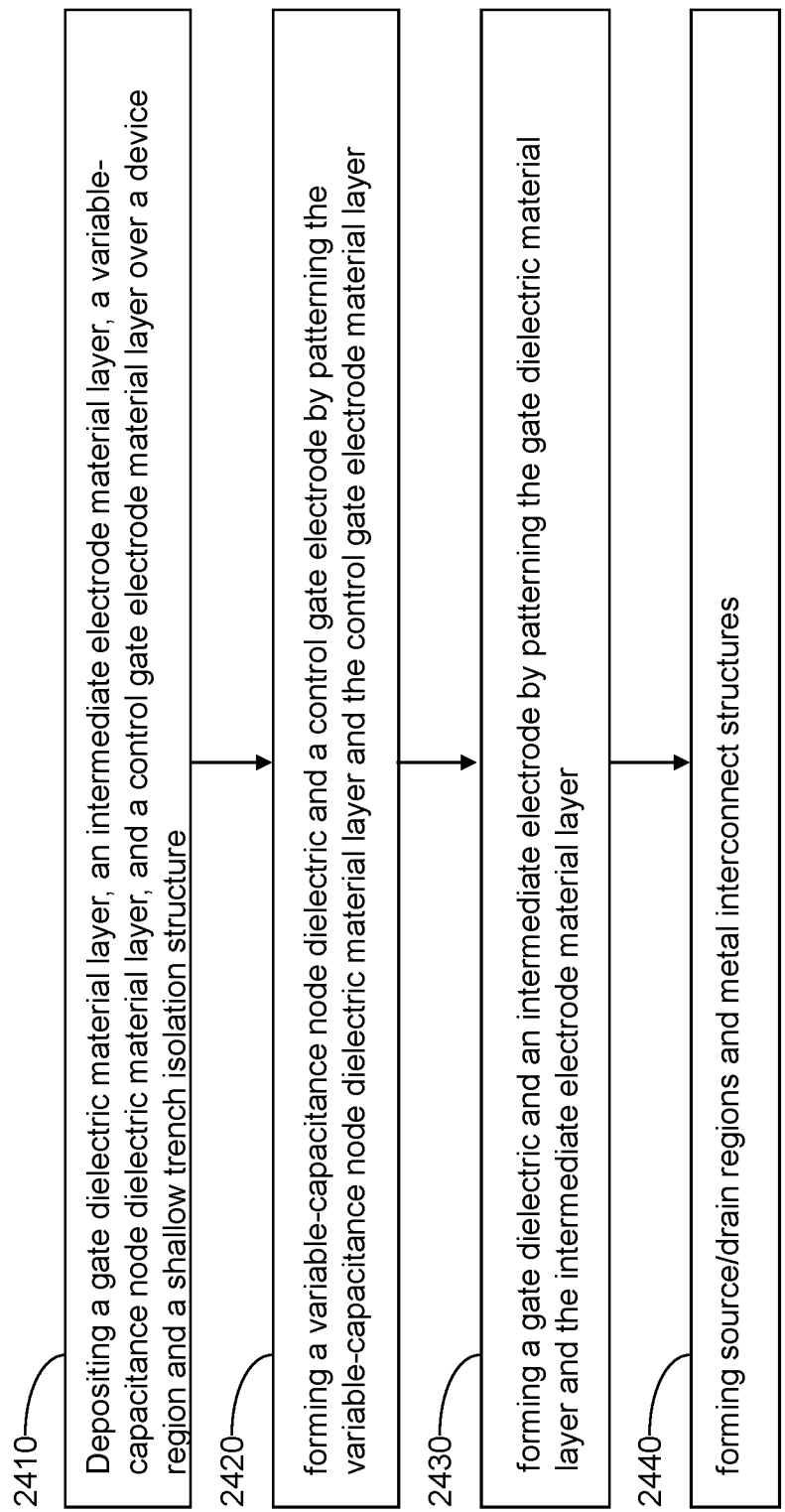
FIG. 24 is a flowchart illustrating steps for manufacturing a memory device of the present disclosure according to an embodiment of the present disclosure.

Referring to FIG. 24, a flowchart illustrates processing steps for manufacturing a memory device of the present disclosure according to an embodiment of the present disclosure. Referring to step 2410 and FIGS. 1A-1C, FIGS. 11A-12C, and FIGS. 15A-15C, a gate dielectric material layer 50L, an intermediate electrode material layer 52L, a variable-capacitance node dielectric material layer 54L, and a control gate electrode material layer 58L may be deposited over a device region and a shallow trench isolation structure 12. Referring to step 2420 and FIGS. 2A-2C, 12A-12C, and 15A-15C, a variable-capacitance node dielectric 54 and a control gate electrode 58 may be formed by patterning the variable-capacitance node dielectric material layer 54L and the control gate electrode material layer 58L, respectively. Referring to step 2430 and FIGS. 3A-3C, 11A-11C, and 16A-16C, a gate dielectric 50 and an intermediate electrode 52 may be formed by patterning the gate dielectric material layer 50L and the intermediate electrode material layer 52L. Referring to step 2440 and FIGS. 4A-7C, 8A-9C, 13A-13C, and 16A-18C, source/drain regions (32, 38) and metal interconnect structures (such as the contact via structures (82, 88, 85, 86) may be formed to provide electrical connection to the various nodes of the field effect transistor and the variable-capacitance capacitor (52, 54, 58).

Referring to all drawings and according to various embodiments of the present disclosure, a memory device comprising a field effect transistor and a variable-capacitance capacitor (52, 54, 58) is provided. The field effect transistor comprises: a source region 32, a drain region 38, and a channel region 35 located within a semiconductor material layer 10; and a gate structure (50, 52) overlying the channel region 35 and comprising a gate dielectric 50 and an intermediate electrode 52. The variable-capacitance capacitor (52, 54, 58) comprises: a lower capacitor plate comprising the intermediate electrode 52; an upper capacitor plate vertically spaced from the lower capacitor plate and comprising a control gate electrode 58; and a variable-capacitance node dielectric 54 located between the lower capacitor plate and the upper capacitor plate and comprising an electrical-field-programmable metal oxide material providing a variable effective dielectric constant. A data bit is stored as a dielectric state of the variable-capacitance node dielectric 54 in the memory device. The area of the upper capacitor plate may be less than the area of the lower capacitor plate, and may be located entirely within the area of the lower capacitor plate.

According to another embodiment of the present disclosure, a memory device comprising a field effect transistor and a variable-capacitance capacitor (52, 54, 58) is provided. The field effect transistor comprises: a source region 32, a drain region 38, and a channel region 35 located within a semiconductor material layer 10; and a gate structure (50, 52) overlying the channel region 35 and comprising a gate dielectric 50 and an intermediate electrode 52. The variable-capacitance capacitor (52, 54, 58) comprises: a lower capacitor plate comprising the intermediate electrode 52; an upper capacitor plate vertically spaced from the lower capacitor plate and comprising a control gate electrode 58; and a variable-capacitance node dielectric 54 located between the lower capacitor plate and the upper capacitor plate and comprising a metal oxide material that provides at reversible electrical field-dependent resistivity modulation.

The various embodiments of the present disclosure may be used to provide a memory device in which the dielectric state of a variable-capacitance node dielectric 54 located between the lower capacitor plate and the upper capacitor plate is used to store a data bit. The lower capacitor plate comprises an intermediate electrode that directly contact a gate dielectric 50, and is electrically floating during sensing. The upper capacitor plate comprises a control gate electrode to which a gate control voltage is applied during programming, erasing, and sensing. The various embodiments of the present disclosure may be used to provide a compact non-volatile memory device. The gate dielectric 50 may be non-tunneling, and thus, endurance and reliability of the memory device is not affected by any tunneling damages or tunneling degradation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of operating a memory device, comprising:
providing a memory device including a field effect transistor and a variable-capacitance capacitor, wherein the field effect transistor comprises a gate structure comprising a gate dielectric and an intermediate electrode, and the variable-capacitance capacitor comprises a lower capacitor plate comprising the intermediate electrode, an upper capacitor plate comprising a control gate electrode, and a variable-capacitance node dielectric located between the lower capacitor plate and the upper capacitor plate, wherein a threshold voltage of the field effect transistor while the intermediate electrode is electrically floating is dependent on a dielectric state of the variable-capacitance node dielectric; and
programming the dielectric state of the variable-capacitance node dielectric into a target dielectric state that is selected from a first dielectric state providing a first capacitance to the variable-capacitance capacitor and a second dielectric state providing a second capacitance to the variable-capacitance capacitor.

2. The method of claim 1, further comprising sensing the dielectric state of the variable-capacitance node dielectric by applying a sensing gate voltage between a first threshold voltage and a second threshold voltage to the control gate electrode.

3. The method of claim 1, wherein the variable-capacitance node dielectric has a variable effective dielectric constant that depends on a hysteresis effect of an electrical field across the upper capacitor plate and the lower capacitor plate.

4. The method of claim 3, further comprising programming the variable-capacitance node dielectric into the first dielectric state or the second dielectric state by applying an electrical field across the upper capacitor plate and the lower capacitor plate.

5. The method of claim 1, wherein programming the dielectric state of the variable-capacitance node dielectric comprises:
applying a programming voltage having a first polarity to the control gate electrode relative to the intermediate electrode; or
applying an erase voltage having a second polarity to the control gate electrode relative to the intermediate electrode, the second polarity being an opposite of the first polarity.

6. The method of claim 1, wherein the variable-capacitance node dielectric comprises a metal oxide material that provides at least one of reversible electrical field-dependent resistivity modulation and reversible electrical field-dependent movement of metal atoms therein.

7. The method of claim 6, wherein the first dielectric state and the second dielectric state provide different electrical resistivities for the metal oxide material of the variable-capacitance node dielectric.

8. The method of claim 1, wherein the variable-capacitance node dielectric comprises an oxygen-vacancy-modulated metal oxide material or a filament-forming metal oxide.

9. The method of claim 8, wherein:
the control gate electrode comprises a transition metal having a melting point higher than 1,000 degrees Celsius or a conductive metallic nitride material; and
the method further comprises changing an oxygen vacancy distribution within the variable-capacitance node dielectric during programming of the dielectric state of the variable-capacitance node dielectric.

10. The method of claim 1, wherein the variable-capacitance node dielectric comprises a metal oxide material that provides reversible electrical field-dependent movement of metal atoms therein.

11. The method of claim 10, wherein:
the control gate electrode comprises a conductive bridge metallic material selected from copper, a copper-containing compound or intermetallic alloy, tellurium, a tellurium-containing compound or intermetallic alloy, aluminum, aluminum, and an aluminum-containing compound or intermetallic alloy; and
the method further comprises changing electrical resistivity within the variable-capacitance node dielectric during programming of the dielectric state of the variable-capacitance node dielectric.

12. A method of operating a memory device, the method comprising:
providing a memory device comprising a combination of a field effect transistor and a variable-capacitance capacitor, wherein the field effect transistor comprises a gate structure comprising a gate dielectric and an intermediate electrode, and wherein the variable-capacitance capacitor comprises a lower capacitor plate which comprises the intermediate electrode; an upper capacitor plate vertically spaced from the lower capacitor plate, wherein the upper capacitor plate comprises a control gate electrode; and a variable-capacitance node dielectric located between the lower capacitor plate and the upper capacitor plate and comprising an electrical-field-programmable dielectric material providing a variable effective dielectric constant; and
storing a data bit as a dielectric state of the variable-capacitance node dielectric in the memory device.

13. The method of claim 12, wherein a threshold voltage of the field effect transistor while the intermediate electrode is electrically floating is dependent on a dielectric state of the variable-capacitance node dielectric.

14. The method of claim 13, further comprising programming the dielectric state of the variable-capacitance node dielectric into a target dielectric state that is selected from a first dielectric state providing a first capacitance to the variable-capacitance capacitor and a second dielectric state providing a second capacitance to the variable-capacitance capacitor.

15. The method of claim 12, further comprising performing a sensing operation on the memory device by:
applying a voltage bias across a drain region and a source region; and
applying a sensing gate voltage to the control gate electrode.

16. The method of claim 15, wherein the field effect transistor has two stable configurations that include:
a first configuration in which the variable-capacitance node dielectric has a first effective dielectric constant and the field effect transistor has a first threshold voltage; and
a second configuration in which the variable-capacitance node dielectric has a second effective dielectric constant and the field effect transistor has a second threshold voltage,
wherein the sensing gate voltage is greater than the first threshold voltage and is less than the second threshold voltage.

17. The method of claim 12, wherein:
the memory device comprises an intermediate electrode contact via structure contacting a top surface of the intermediate electrode, and a control electrode contact via structure contacting a top surface of the control gate electrode; and
the method further comprises:
applying a programming voltage having a first polarity to the control gate electrode relative to the intermediate electrode; and
applying an erase voltage having a second polarity to the control gate electrode relative to the intermediate electrode, the second polarity being an opposite of the first polarity.

18. A method of operating a memory device, the method comprising:
providing a memory device comprising a transistor and a variable-capacitance capacitor, wherein the transistor a gate structure comprising a gate dielectric and an intermediate electrode, and wherein the variable-capacitance capacitor comprises:

a lower capacitor plate comprising the intermediate electrode;

an upper capacitor plate vertically spaced from the lower capacitor plate and comprising a control gate electrode; and a variable-capacitance node dielectric located between the lower capacitor plate and the upper capacitor plate and comprising a metal oxide material that provides reversible electrical field-dependent resistivity modulation, wherein the metal oxide material of the variable-capacitance node dielectric has two dielectric states that is determined by a hysteresis effect of a vertical electrical field across the lower capacitor plate and the upper capacitor plate; and programming the dielectric state of the variable-capacitance node dielectric into a target dielectric state that is selected from a first dielectric state providing a first capacitance to the variable-capacitance capacitor and a second dielectric state providing a second capacitance to the variable-capacitance capacitor.

19. The method of claim 18, wherein the two dielectric states of the variable-capacitance node dielectric comprise:

a first dielectric state having a first effective dielectric constant and a first electrical resistivity; and a second dielectric state having a second effective dielectric constant that is different from the first effective dielectric constant and a second electrical resistivity that is different from the first electrical resistivity.

20. The method of claim 19, wherein:

the variable-capacitance node dielectric comprises an oxygen-vacancy-modulated metal oxide material or a filament-forming metal oxide; and the control gate electrode comprises a transition metal having a melting point higher than 1,000 degrees Celsius or a conductive metallic nitride material.

* * * * *